United States Patent
Hsieh

(10) Patent No.: US 8,372,717 B2
(45) Date of Patent: Feb. 12, 2013

(54) METHOD FOR MANUFACTURING A SUPER-JUNCTION TRENCH MOSFET WITH RESURF STEPPED OXIDES AND TRENCHED CONTACTS

(75) Inventor: Fu-Yuan Hsieh, New Taipei (TW)

(73) Assignee: Force Mos Technology Co., Ltd. (TW)

( * ) Notice: Subject to any disclaimer, the term of this patent is extended or adjusted under 35 U.S.C. 154(b) by 0 days.

(21) Appl. No.: 13/299,648

(22) Filed: Nov. 18, 2011

(65) Prior Publication Data
US 2012/0064684 A1    Mar. 15, 2012

Related U.S. Application Data

(63) Continuation-in-part of application No. 12/654,637, filed on Dec. 28, 2009, now Pat. No. 8,067,800.

(51) Int. Cl.
*H01L 21/336* (2006.01)

(52) U.S. Cl. .................................. 438/270; 257/E21.41
(58) Field of Classification Search .................. 438/270; 257/331, 339, E21.41, E29.256
See application file for complete search history.

(56) References Cited

U.S. PATENT DOCUMENTS
8,067,800 B2 * 11/2011 Hsieh ............................. 257/331

* cited by examiner

*Primary Examiner* — Calvin Lee
*Assistant Examiner* — Monica D Harrison
(74) *Attorney, Agent, or Firm* — Bacon & Thomas, PLLC

(57) ABSTRACT

A method of manufacturing a super junction semiconductor device having resurf stepped oxide structure is disclosed by providing semiconductor silicon layer having trenches and mesas. A plurality of first doped column regions of a second conductivity type in parallel surrounded with second doped column regions of a first conductivity type adjacent to sidewalls of the trenches are formed by angle ion implantations into a plurality of mesas through opening regions in a block layer covering both the mesas and a termination area.

10 Claims, 30 Drawing Sheets

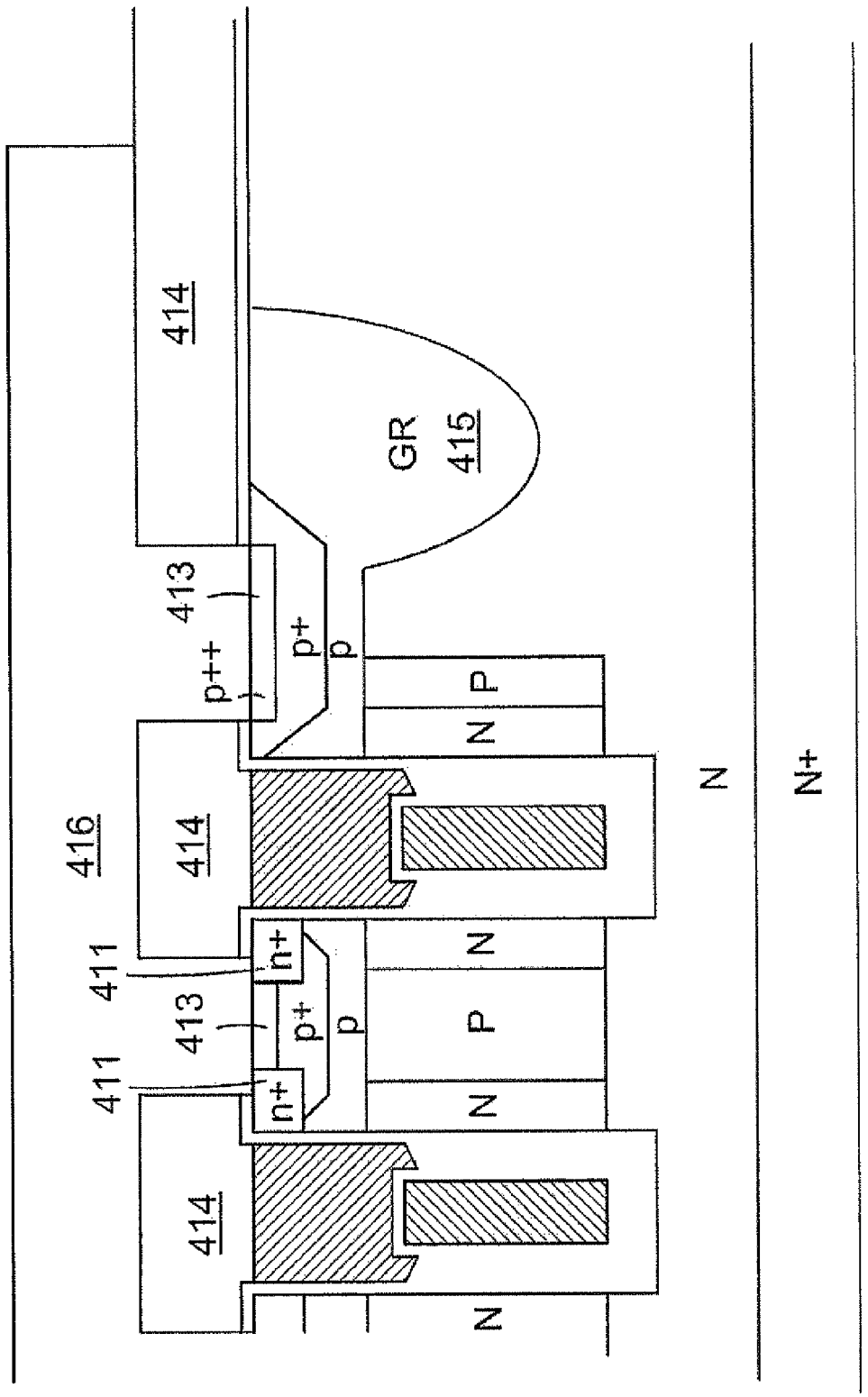

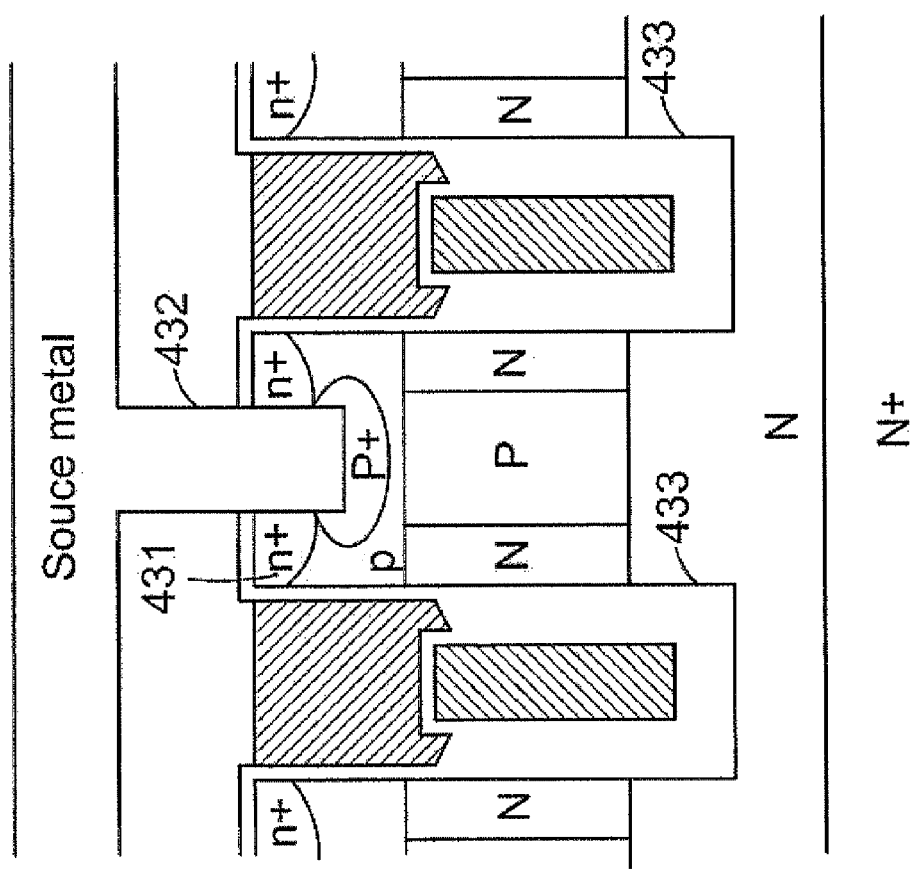

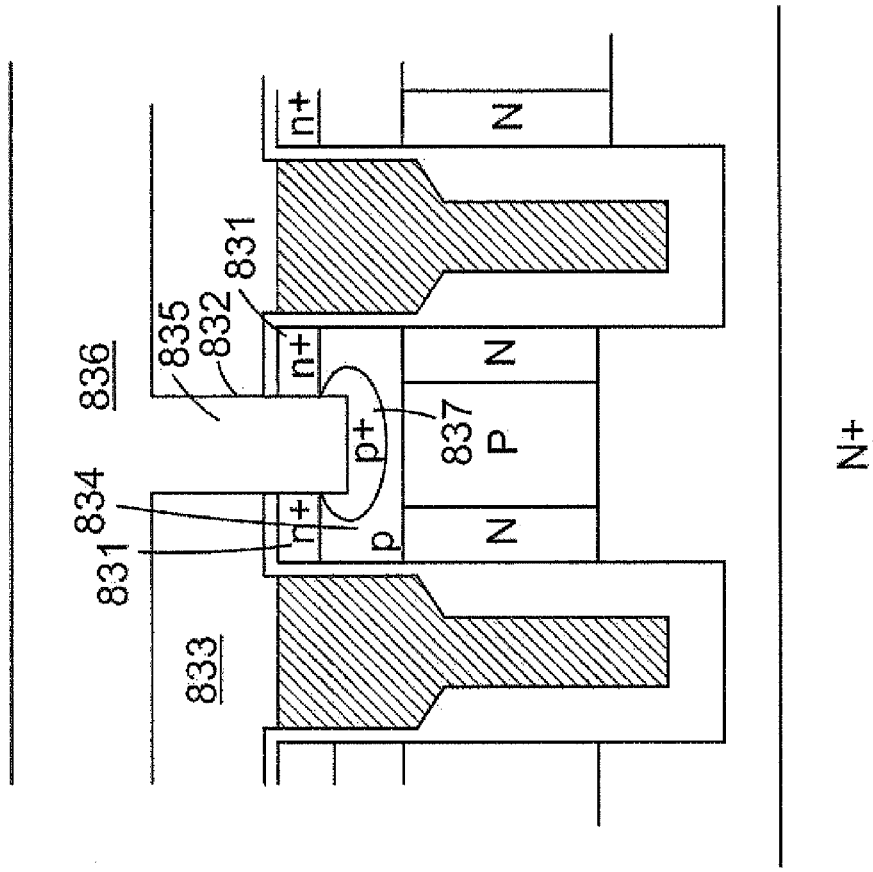

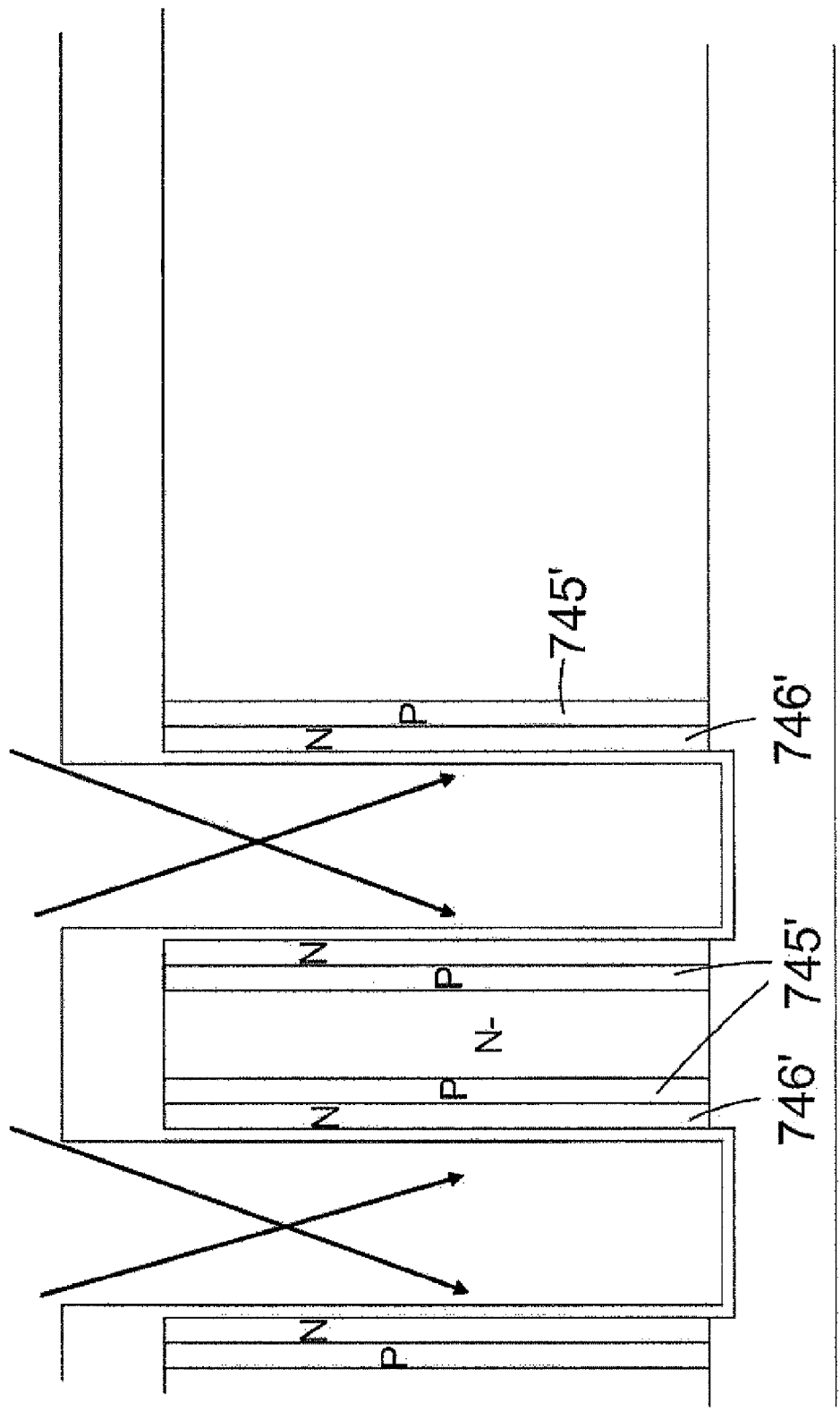

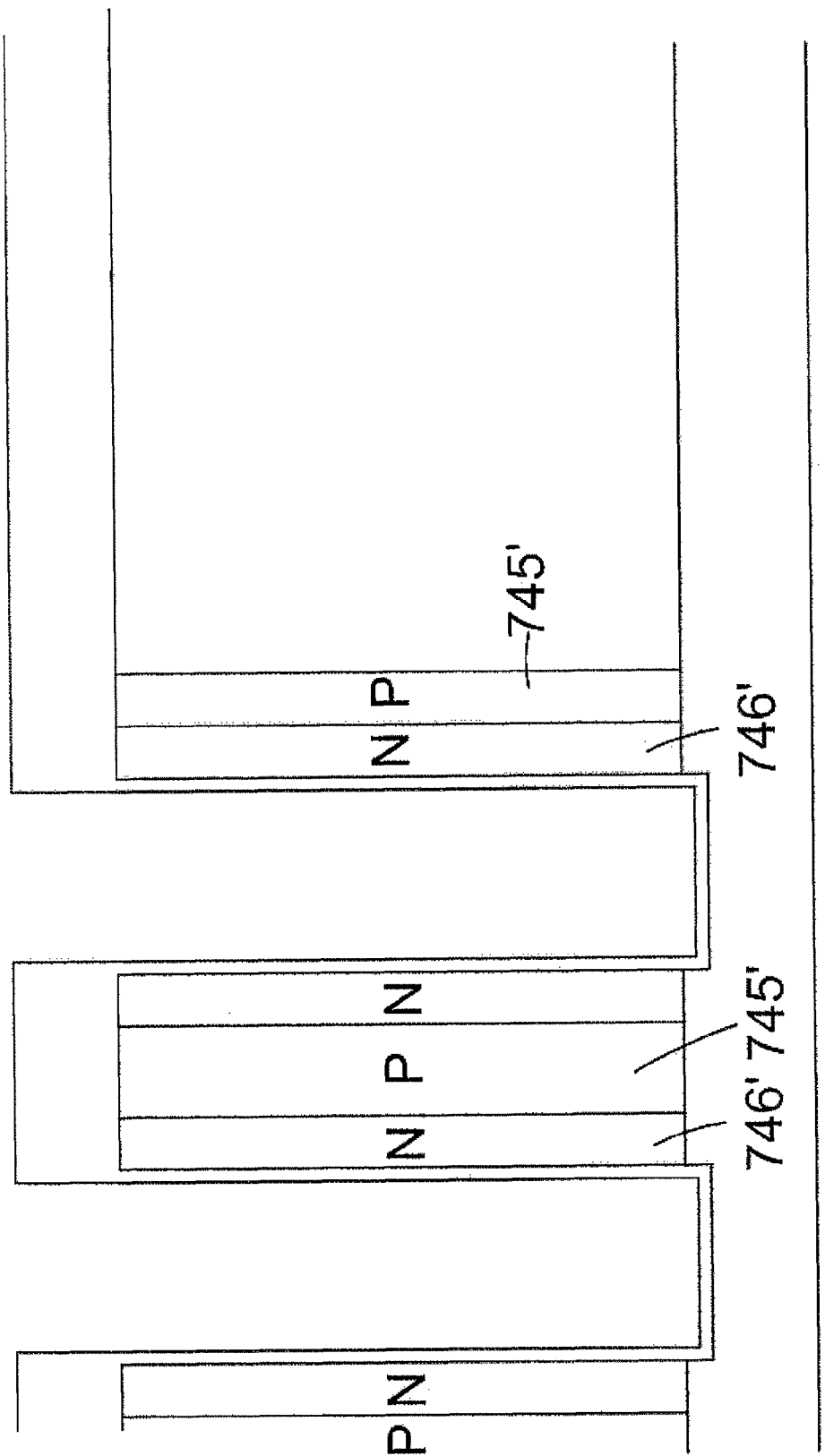

METHOD FOR MANUFACTURING A SUPER-JUNCTION TRENCH MOSFET WITH RESURF STEPPED OXIDES AND TRENCHED CONTACTS

CROSS-REFERENCE TO RELATED APPLICATION

This application is a Continuation-In-Part of U.S. patent application Ser. No. 12/654,637 of the same inventor, filed on Dec. 28, 2009 entitled "super-junction trenched MOSFET with Resurf Step Oxide and the method to make the same".

FIELD OF THE INVENTION

This invention relates to a method for manufacturing a semiconductor power device and in particular to a method of manufacturing super-junction trench MOSFET (Metal Oxide Semiconductor Field Effect Transistor) with resurf stepped oxide and trenched contacts.

BACKGROUND OF THE INVENTION

Compared to the conventional trench MOSFET, the super-junction trench MOSFET are more attractive due to its higher breakdown voltage and lower specific Rds (drain-source resistance). As is known to all, the super-junction trench MOSFET is implemented by a p type column structure and an n type column structure arranged in parallel and connecting to each other onto a heavily doped substrate, however, the manufacturing yield is not stable because it is very sensitive to the fabrication processes and conditions such as: the p type column structure and the a type column structure dopant re-diffusion issue induced by subsequent thermal processes, trapped charges within the column structure, etc. . . . . All that will cause a hazardous condition of charges imbalance to the super-junction trench MOSFET. More specifically, these undesired influences become more pronounced with a narrower column structure width for a lower bias voltage ranging under 200V.

Prior art (paper "Industrialization of Resurf Stepped Oxide Technology for Power Transistor", by M. A. Gajda, etc., and paper "Tunable Oxide-Bypassed Trench Gate MOSFET Breaking the Ideal Super-junction MOSFET Performance Line at Equal Column Width", by Xin Yang, etc.) disclosed device structure in order to resolve the limitation caused by the conventional super-junction trench MOSFET discussed above, as shown in FIG. 1A and FIG. 1B. Except for different terminologies (the device structure in FIG. 1A named with RSO: Resurf Stepped Oxide and the device structure in FIG. 1B named with TOB: Tuable Oxide-Bypassed), both device structures in FIG. 1A and FIG. 1B are basically the same which can achieve a lower specific Rds and a higher breakdown voltage than the conventional super-junction trench MOSFET because the epitaxial layer (epi, as illustrated in FIG. 1A and FIG. 1B) has a higher doping concentration than the conventional super-junction trench MOSFET.

Refer to FIG. 1A and FIG. 1B again, both the device structures have a deep trench with a thick oxide layer along trench sidewalls and bottom into a drift region. Only difference is that, the device structure in FIG. 1A has a single epitaxial layer (N epi, as illustrated in FIG. 1A) while the device structure in FIG. 1B has double epitaxial layers (Epi1 and Epi2, as illustrated in FIG. 1B, Epi1 supported on a heavily doped substrate has a lower doping concentration than Epi2 near a channel region). Due to the p type column structure and the n type column structure interdiffusion, both the device structures in FIG. 1A and FIG. 1B do not have charges imbalance issue, resolving the technical limitation caused by the conventional super-junction trench MOSFET, however, the benefit of both the device structures in FIG. 1A and FIG. 1B over the conventional super-junction trench MOSFET only pronounces at the bias voltage ranging under 200V, which means that, the conventional super-junction trench MOSFET has a lower Rds when the bias voltage is beyond 200V.

U.S. Pat. No. 7,601,597 disclosed a method to avoid the aforementioned p type column structure and the n type structure dopant re-diffusion issue, for example in an N-channel trench MOSFET, by setting up the p type column formation process at a last step after all diffusion processes such as: sacrificial oxidation after trench etch, gate oxidation, P body region formation and n+ source region formation, etc. . . . have been finished. The disclosed super-junction trench MOSFET is shown in FIG. 1C.

However, the disclosed method is not effective because that, first, the p type column structure is formed by growing an additional p type epitaxial layer after etching deep trenches; second, an additional CMP (Chemical Mechanical Polishing) is required for surface planarization after the p type epitaxial layer is grown; third, double trench etches are necessary (one for shallow trenches for trenched gates formation and another for the deep trenches for the p type column structure formation), all the increased cost is not conductive to mass production. Moreover, other factors such as: the charges imbalance caused by the trapped charges within the column structure is still not resolved.

Therefore, there is still a need in the art of the semiconductor power device, particularly for super-junction trench MOSFET design and fabrication, to provide a novel cell structure, device configuration that would resolve these difficulties and design limitations. It is also desirable to provide a method for manufacturing a super-junction device which would avoid the charges imbalance issue, the interdiffusion issue, etc., while improving other performances of the device.

SUMMARY OF THE INVENTION

The present invention provides a semiconductor power device with resurf stepped oxide (RSO) having additional freedom for better performance optimization and manufacturing capability by tuning a thick oxide thickness to minimize influence of the charges imbalance, trapped charges, etc. Therefore, the present invention only requires one kind of trenches and a single epitaxial layer to achieve a better cost effective than the prior arts. Moreover, the present invention also provides trenched contact in a super-junction device for better device shrinkage.

In one aspect, the present invention features a super-junction device with resurf stepped oxides and split gates with a buried source electrode comprising: a substrate of a first conductivity type, an epitaxial layer of the first conductivity type onto the substrate, wherein the epitaxial layer has a lower doping concentration than the substrate; a plurality of trenches starting from an upper surface of the epitaxial layer and extending downward into the epitaxial layer, each trench having a trench bottom; a first insulating layer along an inner surface of a lower portion of each of the trenches; a source electrode within the lower portion of each of the trenches and surrounded by the first insulating layer, a second insulating layer along an inner surface of an upper portion of each of the trenches and covering a top surface of the first insulating layer and the source electrode, wherein the second insulating layer has a thinner thickness than the first insulating layer; a gate electrode within the upper portion of each of the trenches and surrounded by the second insulating layer; a plurality of first doped column regions of a second conductivity type with column shape within the epitaxial layer, formed between the trenches and having column bottoms above the trench bottoms of the trenches; a plurality of second doped column regions of the first conductivity type with column shape within the epitaxial layer, formed adjacent to sidewalls of the trenches and in parallel surrounding the first doped column regions; a body region of the second conductivity type within the epitaxial layer, formed adjacent to sidewalls of the upper portion of the trenches and onto a top surface of the first doped column regions and the second doped column regions between every two adjacent trenches; and a source region of the first conductivity type formed near a top surface of the body region in an active area and flanking the trenches, wherein the source region has a higher doping concentrating than the epitaxial layer. In some preferred embodiment, the present invention further comprises a trenched source-body contact filled with a contact metal plug and penetrating through the source region and extending into the body region.

In another aspect, the present invention features a semiconductor power device with resurf stepped oxides and single gate electrode comprising: a substrate of a first conductivity type; an epitaxial layer of the first conductivity type onto the substrate, wherein the epitaxial layer has a lower doping concentration than the substrate; a plurality of trenches starting from an upper surface of the epitaxial layer and extending downward into the epitaxial layer, each trench having a trench bottom; a first insulating layer along an inner surface of a lower portion of each of the trenches; a second insulating layer along an inner surface of an upper portion of each of the trenches, wherein the second insulating layer has a thinner thickness than the first insulating layer; a single gate electrode within each of the trenches, surrounded by the first insulating layer and the second insulating layer; a plurality of first doped column regions of a second conductivity type with column shape within the epitaxial layer, formed between the trenches and having column bottoms above the trench bottoms of the trenches; a plurality of second doped column regions of the first conductivity type with column shape within the epitaxial layer, formed adjacent to sidewalls of the trenches and in parallel surrounding the first doped column regions; a body region of the second conductivity type within the epitaxial layer, formed adjacent to sidewalls of the upper portion of the trenches and onto a top surface of the first doped column regions and the second doped column regions between every two adjacent trenches, and a source region of the first conductivity type formed near a top surface of the body region in an active area and flanking the trenches, wherein the source region has a higher doping concentration than the epitaxial layer. In some preferred embodiment, the present invention further comprises a trenched source-body contact filled with a contact metal plug and penetrating through the source region and extending into the body region.

Preferred embodiments include one or more of the following features: the trench bottoms of the trenches are above the substrate; the trenches further extend into the substrate; the present invention further comprises an avalanche enhancement doped region of the second conductivity type within the body region and below the source region, wherein the avalanche enhancement doped region is formed between a pair of the source regions and having a higher doping concentration than the body region; the present invention further comprises a shallow contact doped region of the second conductivity type near the top surface of the body region, wherein the shallow contact doped region is formed between a pair of the source regions and onto the avalanche enhancement doped region, wherein the shallow contact doped region has a higher doping concentration than the avalanche enhancement doped region; the present invention further comprises a body contact doped region within the body region and surrounding at least bottom of the trenched source-body contact underneath the source region, wherein the body contact doped region has a higher doping concentration than the body region; the present invention further comprises a guard ring in a termination area when the breakdown voltage is lower than or equal to 100V; the present invention further comprises a guard ring and multiple floating rings in a termination area when the breakdown voltage is higher than 100V; the present invention further comprises a source metal onto a contact interlayer and connected to the source region and the body region by the trenched source-body contact; the present invention further comprises a source metal onto a contact interlayer and penetrating through the contact interlayer to contact with the shallow contact doped region and the source region in the active area or only contact to the shallow contact doped region near the termination area; the source region is formed by later diffusion and has a higher doping concentration and a greater junction depth along sidewalls of the trenched source-body contact than along a channel region near the trenches, and the source region has a doping profile of Gaussian-distribution from the sidewalls of the trenched source-body contact to the channel region; the contact metal plug is a tungsten layer padded by a barrier metal layer of Ti/TiN or Co/TiN; the contact metal plug is a source metal layer such as Al alloys padded with Ti/TiN or Co/TiN.

The invention also features a method of manufacturing a semiconductor power device, comprising: (a) growing an epitaxial layer of a first conductivity type upon a heavily doped substrate of the first conductivity type; (b) forming a block layer on a top surface of the epitaxial layer; (c) forming a trench mask on the block layer; (d) forming a plurality of trenches, and mesas between adjacent trenches in the epitaxial layer by etching through open regions in the block layer; (e) keeping the block layer substantially covering the mesas and a termination area after formation of the trenches to block sequential angle ion implantations into top surfaces of the mesas and the termination area; (f) carrying out an angle ion implantation of a second conductivity type dopant into the mesas through the open regions in the block layer to form a first doped column regions between the adjacent trenches; (g) carrying out an angle ion implantation of the first conductivity type dopant into the mesas through the open regions in the block layer to form a second doped column regions adjacent to sidewalls of the trenches and in parallel surrounding the first doped column regions; (h) removing the block layer after formation of the first and the second doped column regions; (i) forming a first insulation layer along inner surface of the trenches; (j) depositing a first doped poly-silicon filling the trenches serving as source electrodes; (k) etching back the source electrodes and the first insulation layer from upper portion of the trenches and from the top surface of the epitaxial layer; (l) forming a second insulation layer as a gate oxide layer along upper sidewalls of the trenches and onto top surfaces of the source electrodes, wherein the second insulation layer has a thinner thickness than the first insulation layer; (m) depositing a second doped poly-silicon filling the upper portion of the trenches to serve as gate electrodes; (n) etching back the gate electrodes by CMP (Chemical Mechanical Polishing) or plasma etch from the top surfaces of the mesas; (o) applying a body mask onto the top surface of the epitaxial layer; (p) carrying out a body implantation of the second conductivity type dopant and a body diffusion to form body regions; (q) removing the body mask and applying a source mask onto the top surface of the epitaxial layer; and (r) carrying out a source implantation of the first conductivity type dopant and a source diffusion to form source regions.

In some preferred embodiment, the method further comprises: prior to carrying out angle Ion Implantation with a dopant of the first conductivity type, diffusing the dopant of the second conductivity type to form the first doped column regions between two adjacent of the trenches; prior to filling the trenches with an insulating material, diffusing the dopant of the first conductivity type to form the second doped regions adjacent to sidewalls of the trenches and in parallel surrounding the first doped column regions. In some other preferred embodiment, the method further comprises: prior to filling the trenches with an insulating material, diffusing both the dopant of the first conductivity type and the second conductivity type simultaneously to respectively form the first doped column regions between two adjacent trenches and form the second doped column regions adjacent to sidewalls of the trenches and in parallel surrounding the first doped column regions.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein:

FIG. 2C is a cross-sectional view of another preferred embodiment according to the present invention.

FIG. 4C is a cross-sectional view of another preferred embodiment according to the present invention.

FIG. 6A is a cross-sectional view of another preferred embodiment according to the present invention.

FIGS. 8A~8C are a serial of side cross-sectional views for showing another preferred method for fabricating the first and second doped column regions.

DETAILED DESCRIPTION OF THE EMBODIMENTS

In the following Detailed Description, reference is made to the accompanying drawings, which forms a part thereof, and in which is shown by way of illustration specific embodiments in which the invention may be practiced. In this regard, directional terminology, such as "top", "bottom", "front", "back", etc., is used with reference to the orientation of the Figure(s) being described. Because components of embodiments can be positioned in a number of different orientations, the directional terminology is used for purpose of illustration and is in no way limiting. It is to be understood that other embodiments may be utilized and structural or logical changes may be make without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1A:
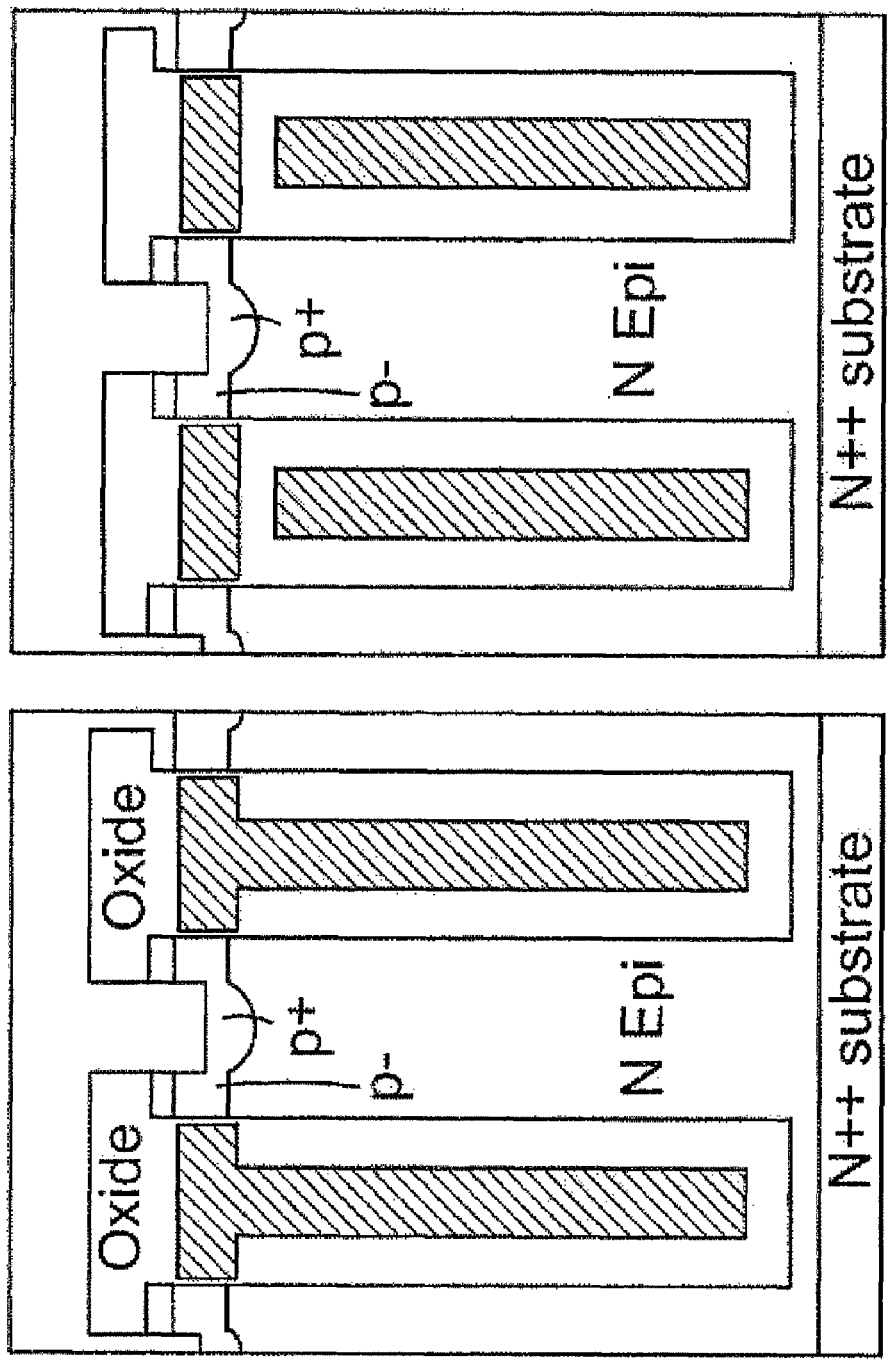
FIG. 1A is a cross-sectional view of a super-junction trench MOSFET of prior art.
Figure 1B:
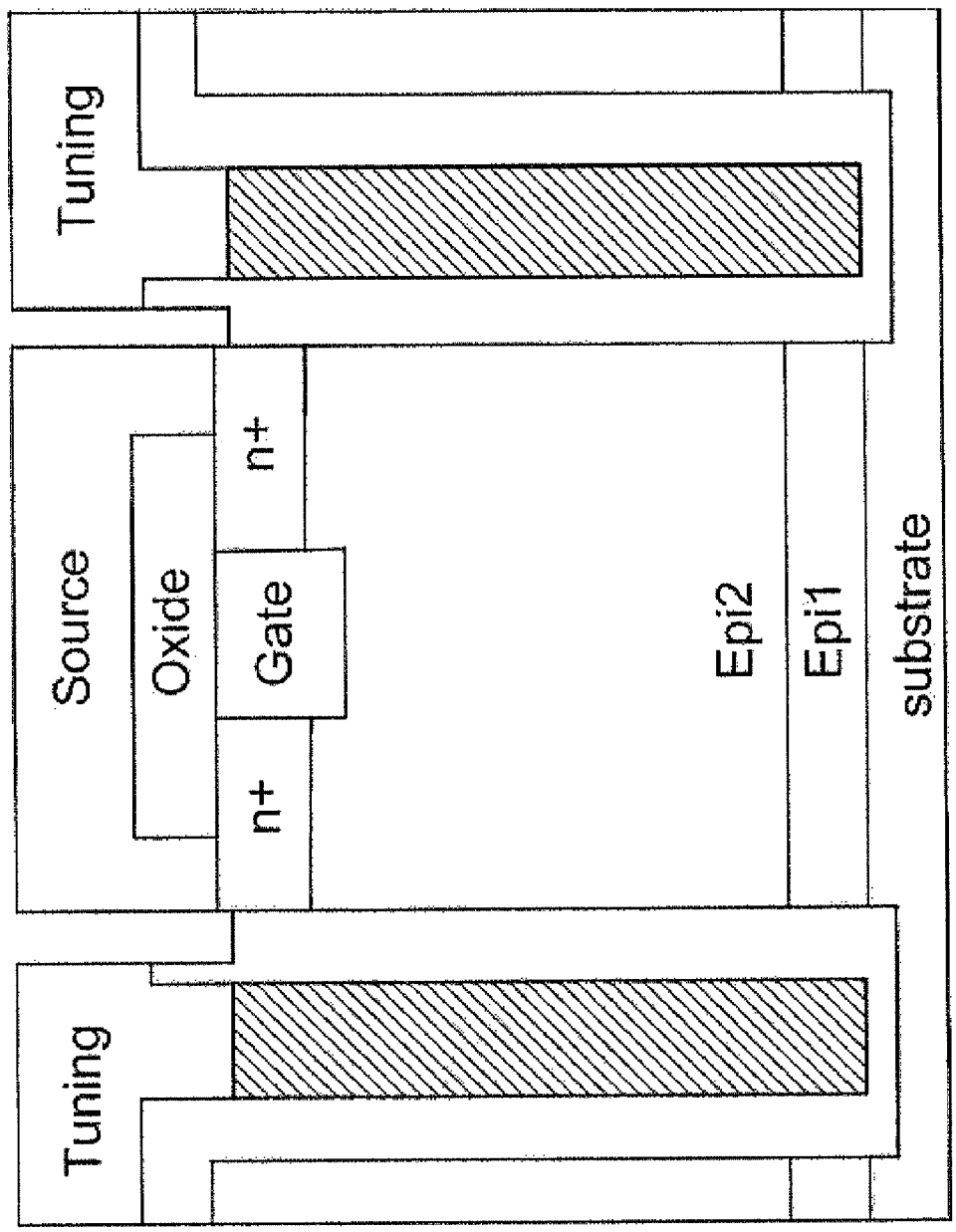
FIG. 1B is a cross-sectional view of a trench MOSFET of another prior art.
Figure 1C:
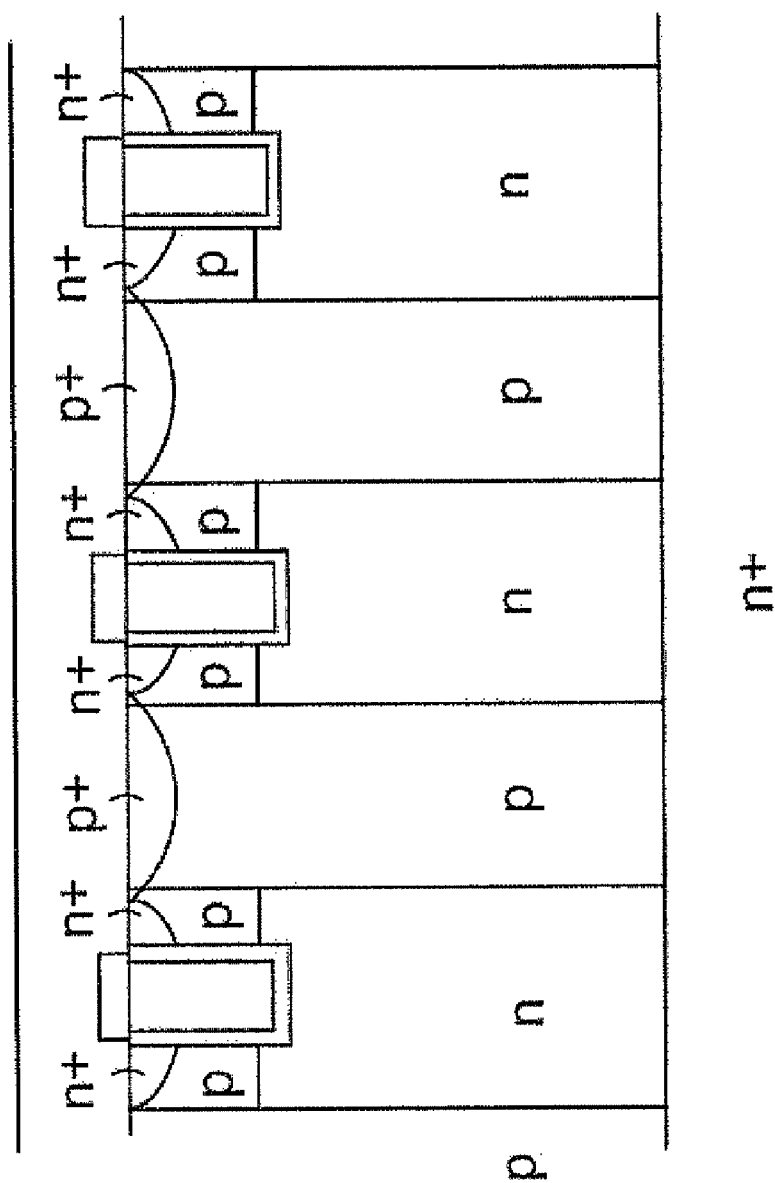
FIG. 1C is a cross-sectional view of a trench MOSFET of another prior art.
Figure 2A:
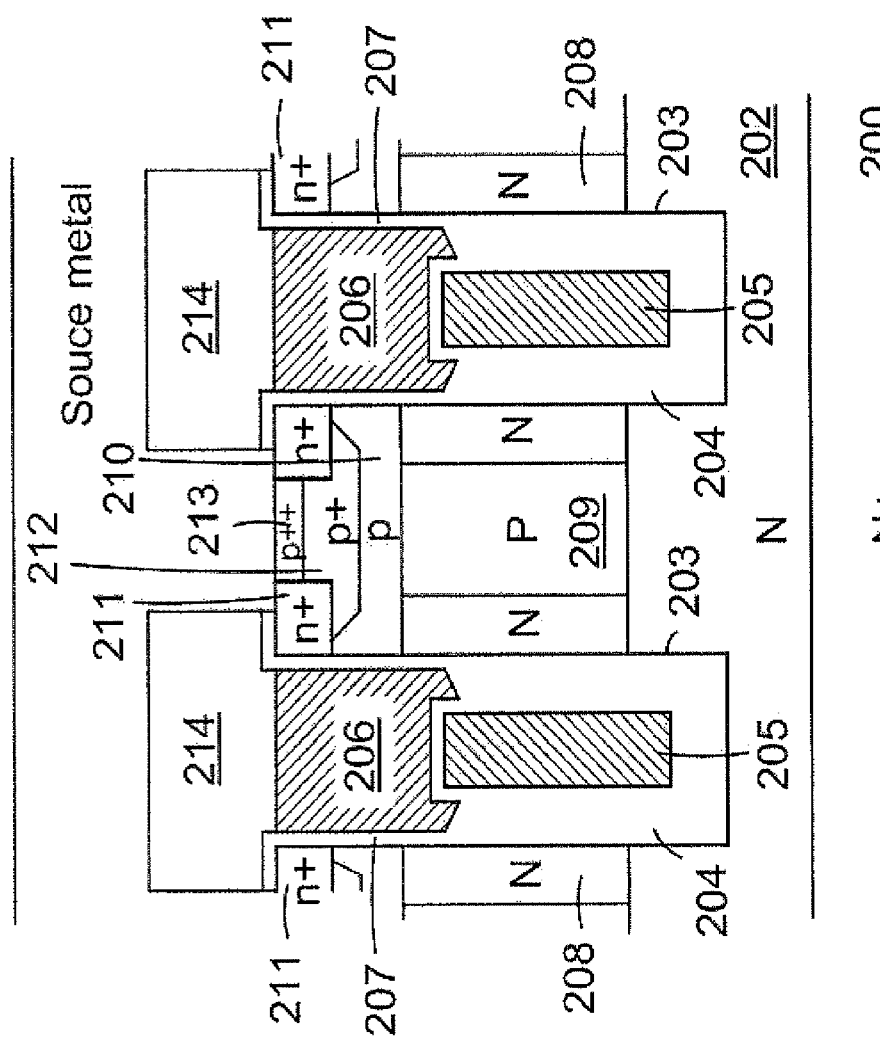
FIG. 2A is a cross-sectional view of a preferred embodiment according to the present invention.

Please refer to FIG. 2A for a preferred embodiment of this invention where an N-channel super-junction trench MOSFET is formed in an N epitaxial layer 202 onto an N+ substrate 200. A plurality of trenches 203 are formed starting from an upper surface of the N epitaxial layer 202 and vertically down extending, not reaching the interface of the N+ substrate 200 and the N epitaxial layer 202. Into each of the trenches 203, a doped poly-silicon layer is deposited filling a lower portion of the trench 203 to serve as a source electrode 205 padded by a first insulating layer 204. Into an upper portion of each of the trenches 203, another doped poly-silicon layer is deposited and padded by a second insulating layer 207 to serve as a gate electrode onto the source electrode 205 and the first insulating layer 204, wherein the second insulating layer 207 has a thinner thickness than the first insulating layer 204. Between every two adjacent trenches 203, a pair of N type second doped column regions 208 are formed adjacent to sidewalls of the trenches and surround in parallel a P type first doped column region 209. Onto a top surface of the N type second doped column regions 208 and the P type first doped column region 209 between a pair of adjacent trenches 203, a p body region 210 is formed with an n+ source region 211 near its top surface and flanking the trenches 203. Between a pair of the source regions 211, a p+ avalanche enhancement doped region 212 is formed with a p++ shallow contact doped region 213 near its top surface. Onto a top surface of the gate electrode 206, a contact interlayer 214 is formed to isolate the gate electrode 206 from a source metal formed onto the contact interlayer 214.

Figure 2B:
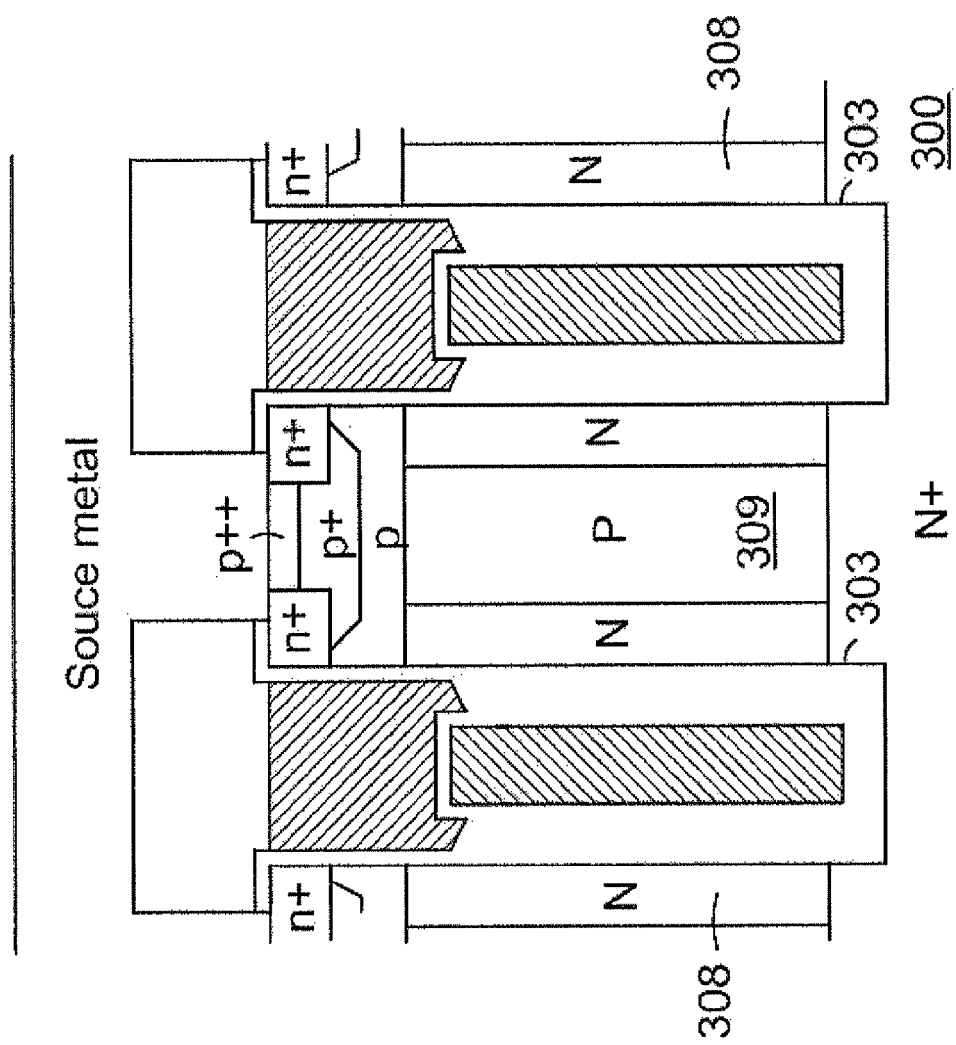
FIG. 2B is a cross-sectional view of another preferred embodiment according to the present invention.

FIG. 2B shows another preferred embodiment of the present invention, which is similar to that in FIG. 2A except that, in FIG. 2B, the trenches 303 are starting from the top surface of the N epitaxial layer and vertically down extending into the N+ substrate 300. Besides, the N type second doped column regions 308 and the P type first doped column regions 309 are reaching the interface of the N epitaxial layer and the N+ substrate 300.

FIG. 2C shown another preferred embodiment of the present invention, which is similar to that in FIG. 2A except that, in FIG. 2C, the N-channel super-junction trench MOSFET further comprises a guard ring 415 (GR, as illustrated in FIG. 2C) in a termination area. Besides, the source metal 416 is formed onto the contact interlayer 414 and penetrating through the contact interlayer 414 to contact with the p++ shallow contact doped region 413 and the n+ source region 411 in an active area or only contact with the p++ shallow contact doped region 413 near the termination area.

Figure 2D:
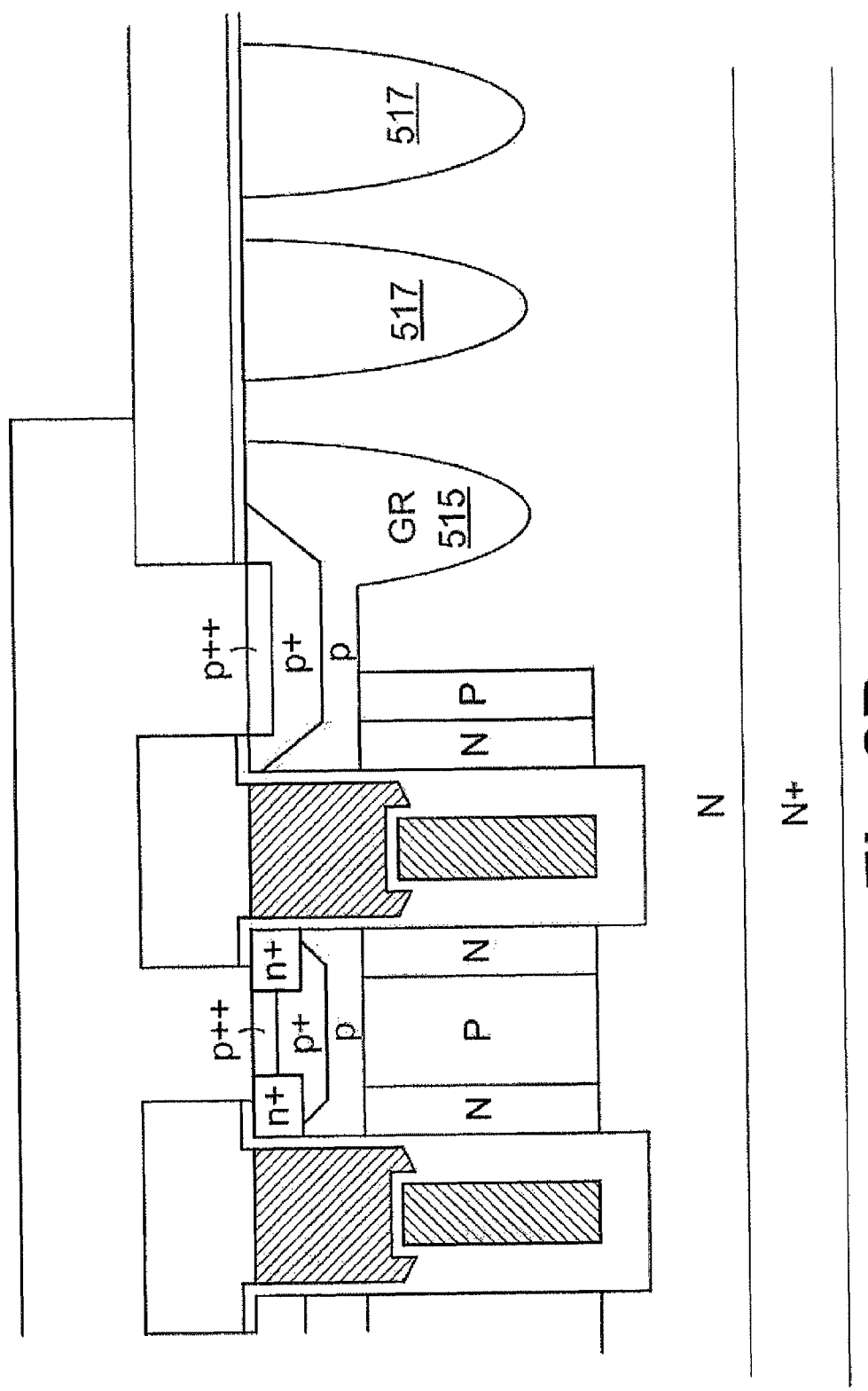
FIG. 2D is a cross-sectional view of another preferred embodiment according to the present invention.

FIG. 2D shows another preferred embodiment of the present invention, which is similar to that in FIG. 2C except that, in FIG. 2D, the N-channel super-junction trench MOSFET further comprises a guard ring 515 and multiple floating rings 517 in the termination area.

Figure 2E:
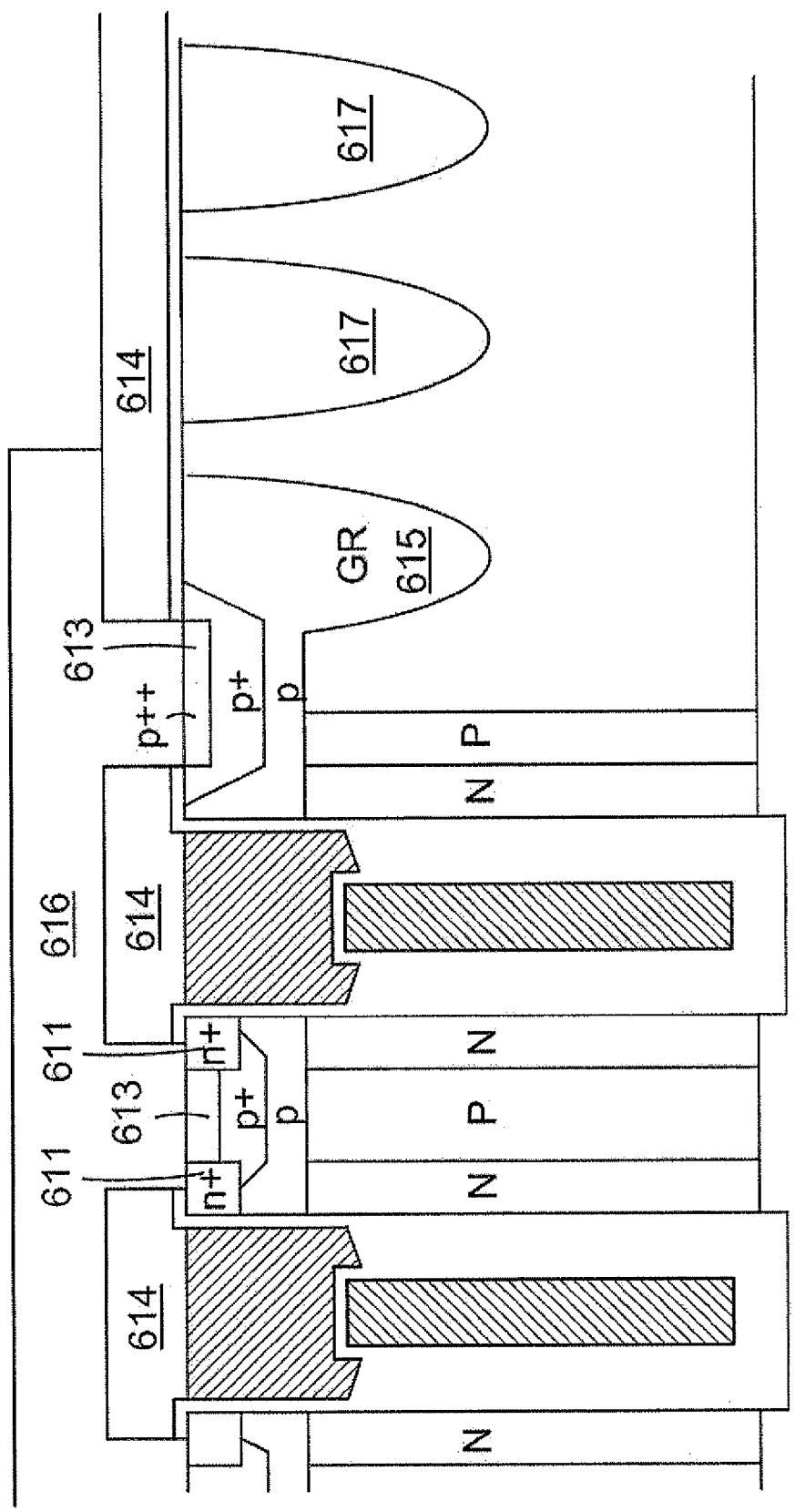
FIG. 2E is a cross-sectional view of another preferred embodiment according to the present invention.

FIG. 2E shows another preferred embodiment of the present invention, which is similar to that in FIG. 2B except that, in FIG. 2E, the N-channel super-junction trench MOSFET further comprises a guard ring 615 and multiple floating rings 617 in the termination area. Besides, the source metal 616 is formed onto the contact interlayer 614 and penetrating through the contact interlayer 614 to contact with the p++ shallow contact doped region 613 and the n+ source region 611 in the active area or only contact with the p++ shallow contact doped region 613 near the termination area.

Figure 3A:
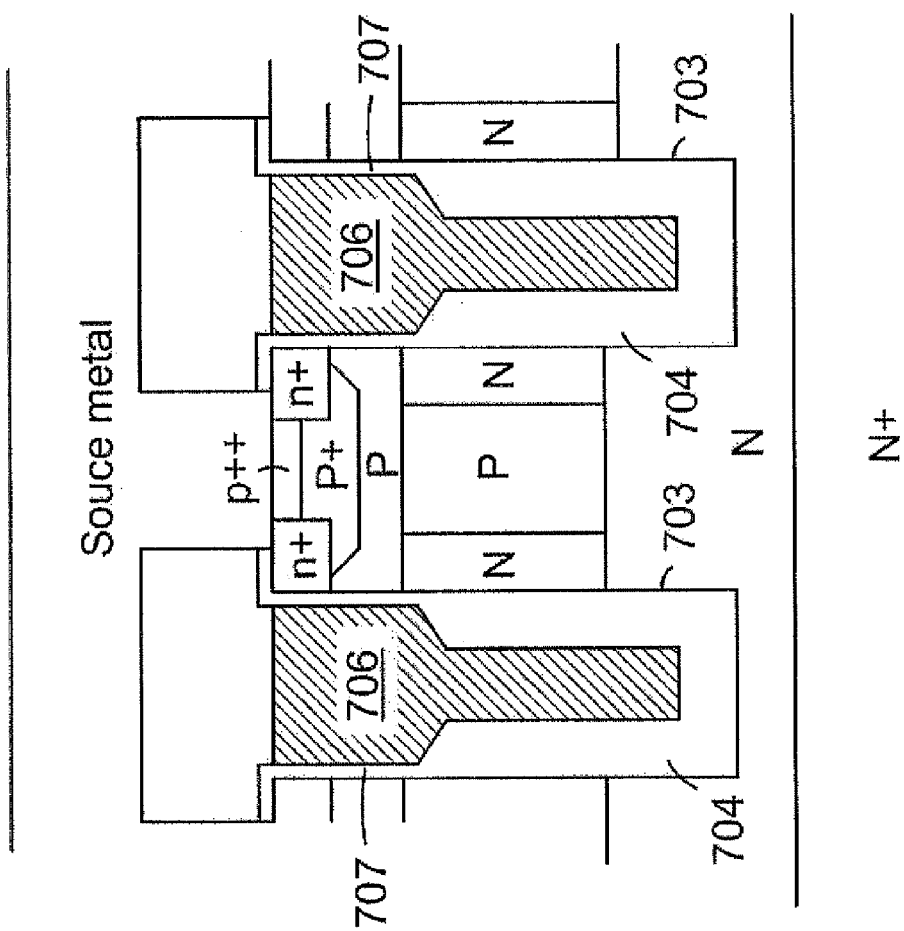
FIG. 3A is a cross-sectional view of another preferred embodiment according to the present invention.

FIG. 3A shows another preferred embodiment of the present invention, which is similar to that in FIG. 2A except that, in the trenches 703, a single gate electrode 706 is formed padded by the first insulating layer 704 in a lower portion and by the second insulating layer 707 in an upper portion. Furthermore, the second insulating layer 707 has a thinner thickness than the first insulating layer 704.

Figure 3B:
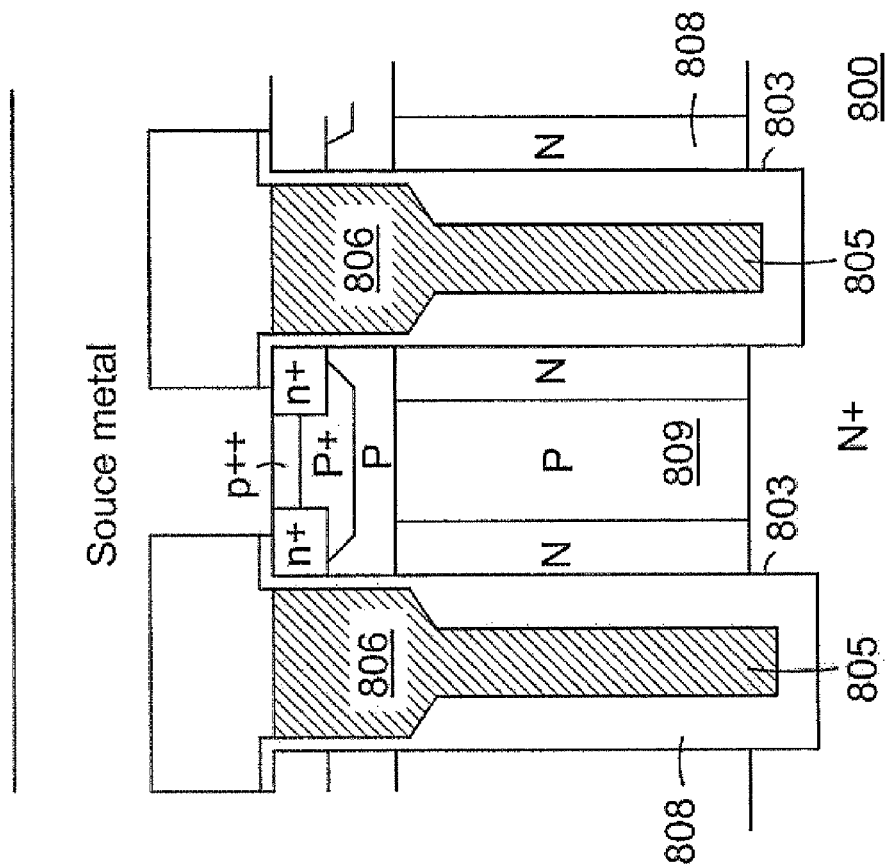
FIG. 3B is a cross-sectional view of another preferred embodiment according to the present invention.

FIG. 3B shows another preferred embodiment of the present invention, which is similar to that in FIG. 3A except that, in FIG. 3B, the trenches 803 are starting from the top surface of the N epitaxial layer and vertically down extending into the N+ substrate 800, the single gate electrode 806 is also extending into the N+ substrate 800. Besides, the N type second doped column regions 808 and the P type first doped column regions 809 are reaching the interface of the N epitaxial layer and the N+ substrate 800.

Figure 4A:
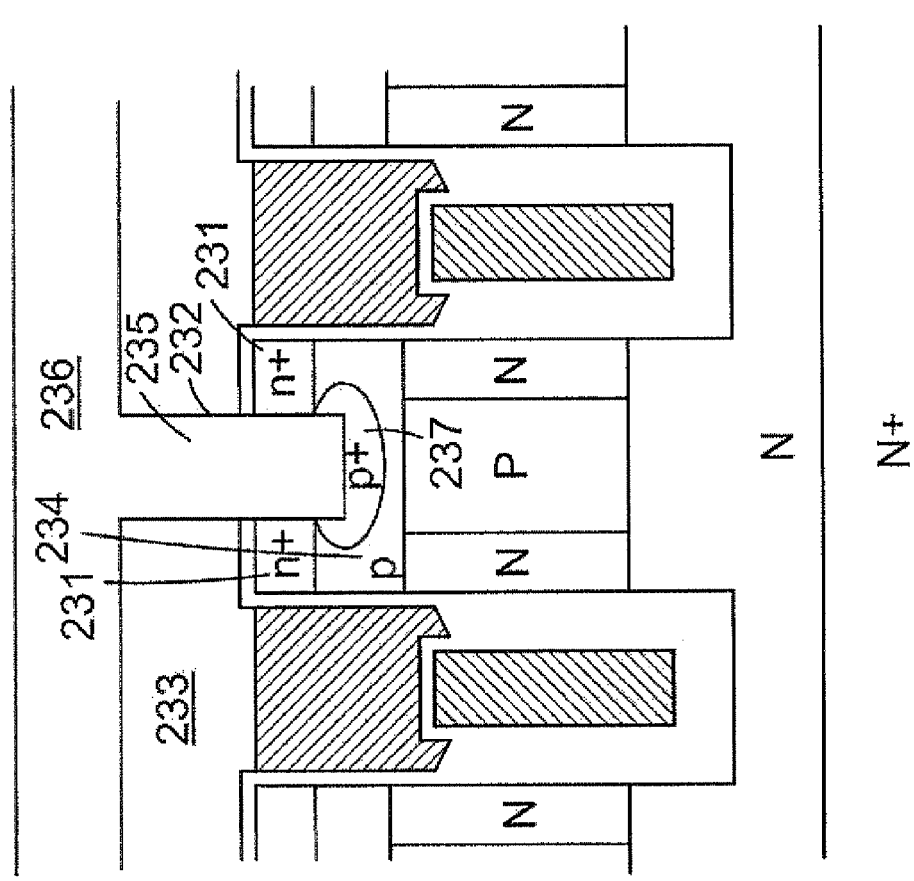
FIG. 4A is a cross-sectional view of another preferred embodiment according to the present invention.

FIG. 4A shows another preferred embodiment of the present invention, which is similar to that in FIG. 2A except that, in FIG. 4A, the source metal 236 is connected to the n+ source region 231 by a trenched source-body contact 232. The trenched source-body contact 232 is penetrating through the contact interlayer 233, the n+ source region 231 and extending into the p body region 234, the trenched source-body contact 232 is filled with the source metal 236 composed of an Al alloys layer padded by a barrier metal layer of Ti/TiN or Co/TiN as a contact metal plug 235, for example, a source metal plug as employed in FIG. 4A. Furthermore, in the p body region 234, a p+ body contact doped region 237 is formed surrounding at least bottom of the trenched source-body contact 232 underneath the n+ source region 231 to reduce the contact resistance between the p body region 234 and the contact metal plug 235 in the trenched source-body contact 232.

Figure 4B:
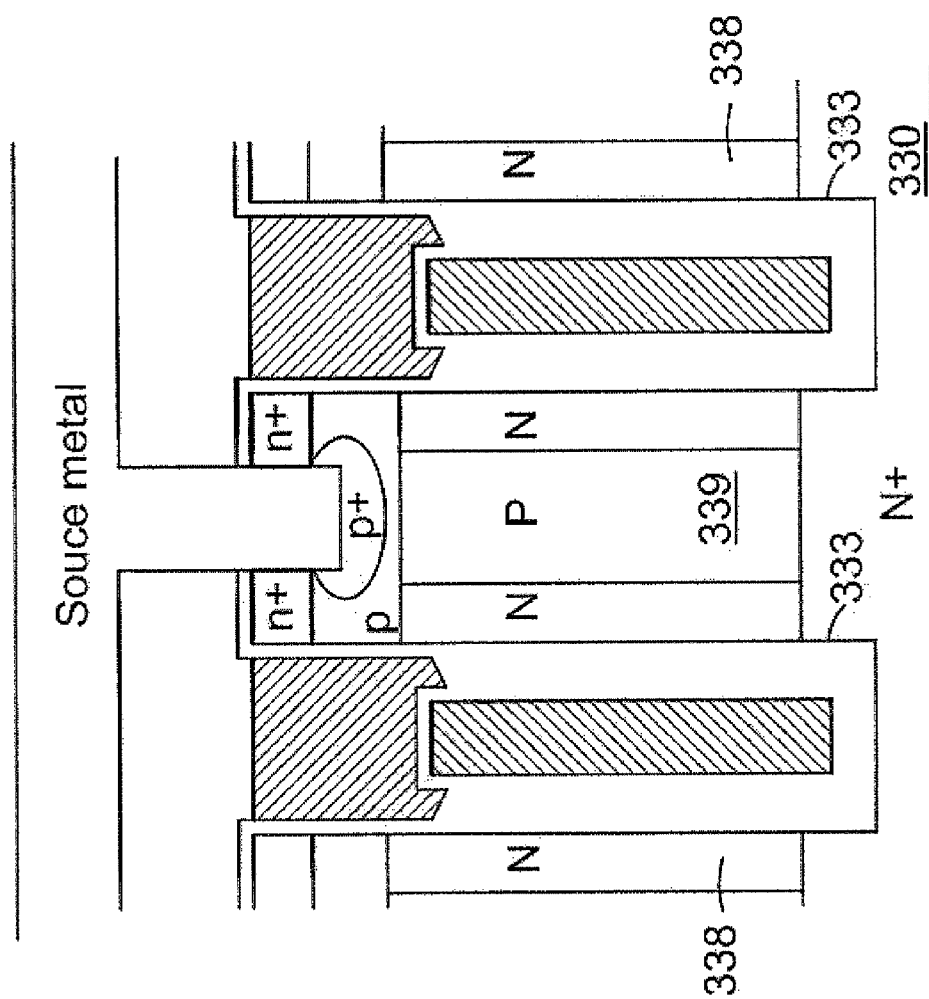
FIG. 4B is a cross-sectional view of another preferred embodiment according to the present invention.

FIG. 4B shows another preferred embodiment of the present invention, which is similar to that in FIG. 4A except that, in FIG. 4B, the trenches 333 are starting from the top surface of the N epitaxial layer and vertically down extending into the N+ substrate 330. Besides, the N type second doped column regions 338 and the P type first doped column regions 339 are reaching the interface of the N epitaxial layer and the N+ substrate 330.

FIG. 4C shows another preferred embodiment of the present invention, which is similar to that in FIG. 4A except that, in FIG. 4A, the n+ source region 231 is formed by ion implantation and has a uniform doping concentration and junction depth from along sidewalls of the trenched source-body contact 232 to along a channel region near the trenches. However, in FIG. 4C, the n+ source region 431 is formed by a lateral diffusion from center between two adjacent trenches 433 and has a higher doping concentration and a greater junction depth along the sidewalls of the trenched source-body contact 432 than along the channel region near the trenches 433, furthermore, the n+ source region 431 has a doping profile of a Gaussian-distribution from the sidewalls of the trenched source-body contact 432 to the channel region near the trenches 433.

Figure 4D:
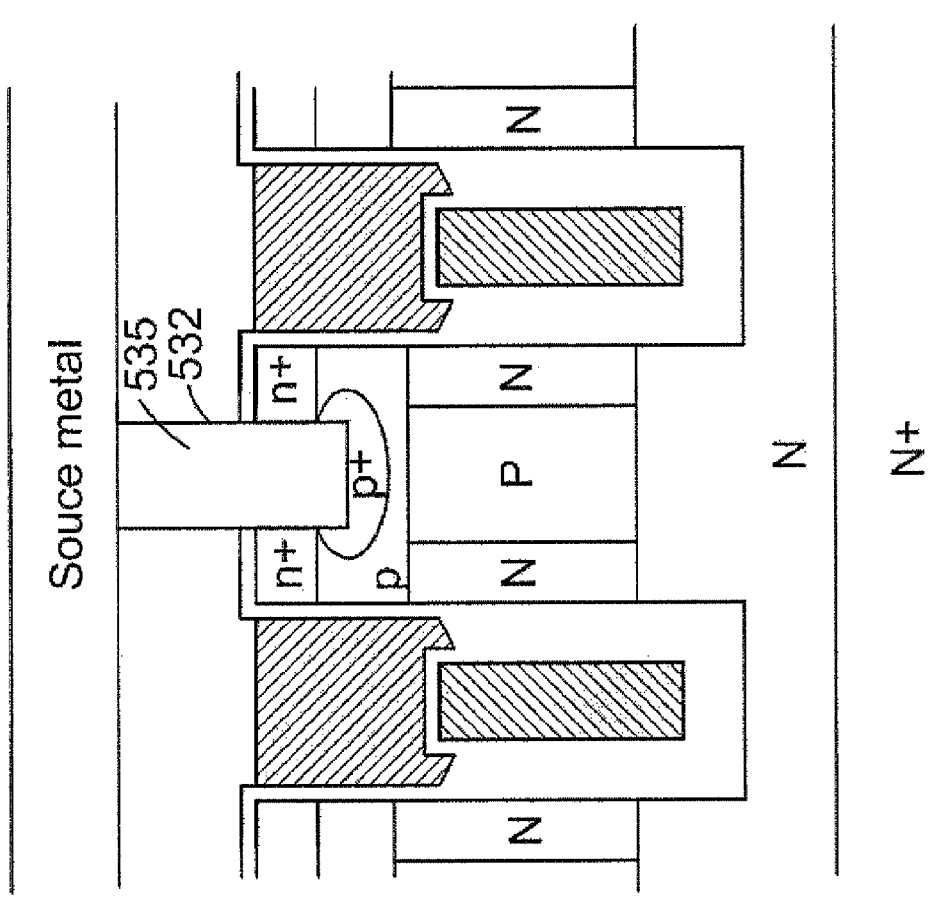
FIG. 4D is a cross-sectional view of another preferred embodiment according to the present invention.

FIG. 4D shows another preferred embodiment of the present invention, which is similar to that in FIG. 4A except that, in FIG. 4D, the contact metal plug 535 in the trenched source-body contact 532 is a tungsten layer padded by a barrier metal layer of Ti/TiN or Co/TiN. An Al alloys layer overlying a contact resistance reduction layer of Ti or Ti/TiN as a source metal onto a contact interlayer and the contact metal plug 535.

Figure 5A:
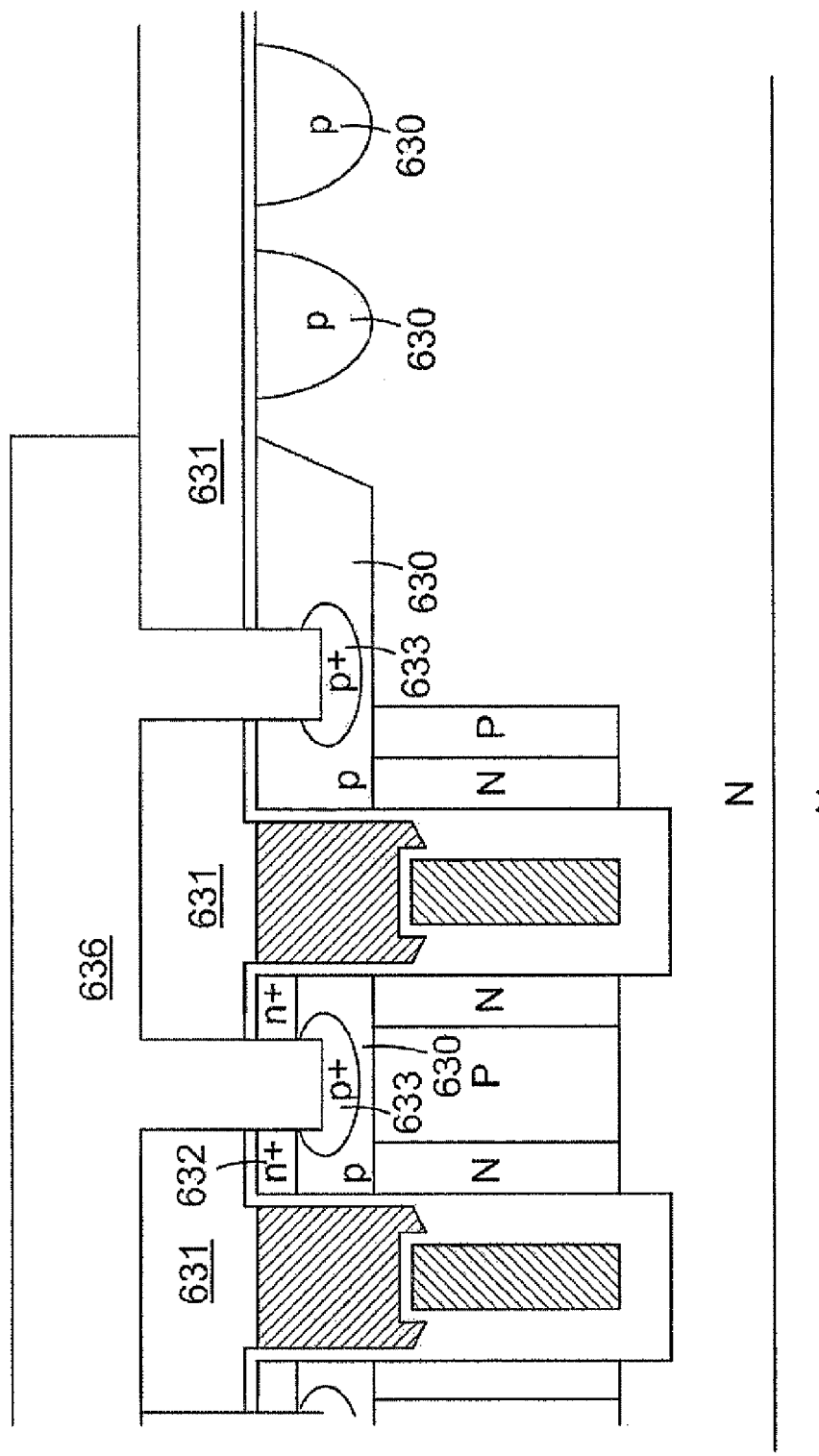
FIG. 5A is a cross-sectional view of another preferred embodiment according to the present invention.

FIG. 5A shows another preferred embodiment of the present invention, which is similar to that in FIG. 4A except that, in FIG. 5A, the N-channel super-junction trench MOSFET further comprises multiple p body regions 630 having a floating voltage in a termination area. Besides, the source metal 636 is formed onto the contact interlayer 631 and penetrating through the contact interlayer 631 to contact with the n+ source region 632, the p body region 630 and the p+ body contact doped region 633 in the active area or only contact with the p body region 630 and the p+ body contact doped region 633 near the termination area.

Figure 5B:
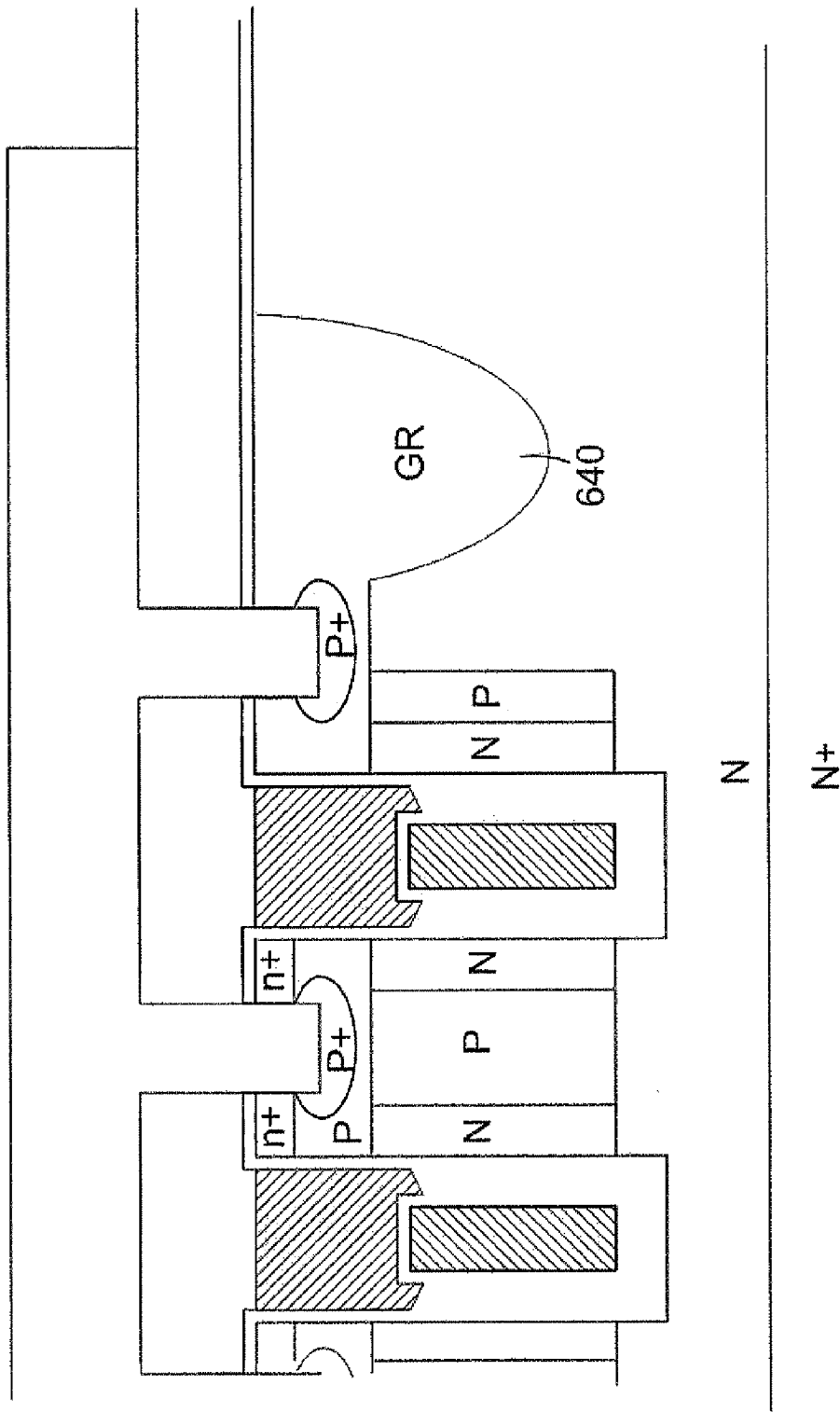
FIG. 5B is a cross-sectional view of another preferred embodiment according to the present invention.

FIG. 5B shows another preferred embodiment of the present invention, which is similar to that in FIG. 5A except that, in FIG. 5B, the N-channel super-junction trench MOSFET comprises a different termination area comprising a P type guard ring 640 (GR, as illustrated in FIG. 5B) having a junction depth greater than the P body regions.

Figure 5C:
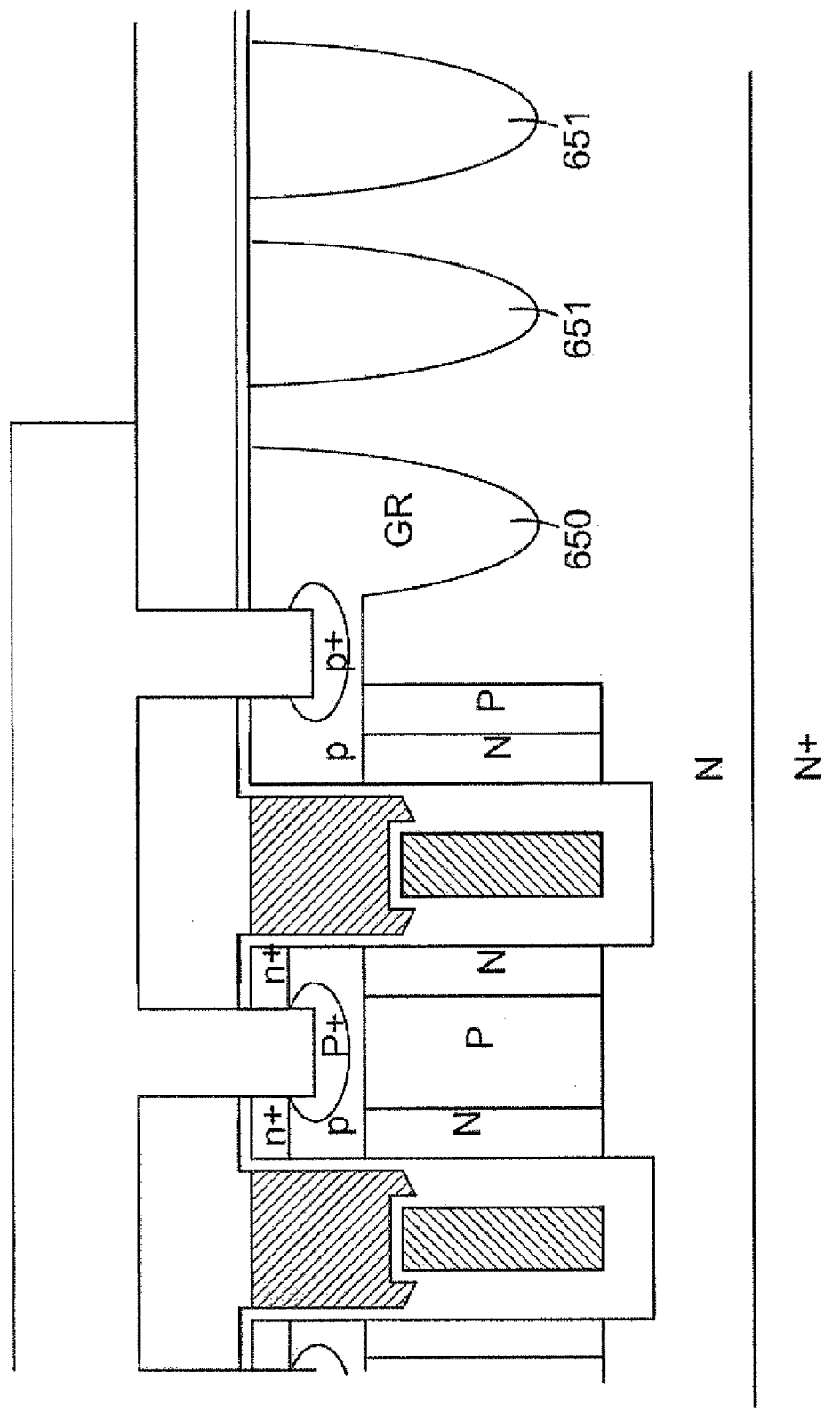
FIG. 5C is a cross-sectional view of another preferred embodiment according to the present invention.

FIG. 5C shows another preferred embodiment of the present invention, which is similar to that in FIG. 5B except that, in FIG. 5C, the N-channel super-junction trench MOSFET further comprises a P guard ring 650 connected with the n+ source regions, and multiple P type floating guard rings 651 having a floating voltage in the termination area wherein the P type guard ring 650 and the multiple P type floating rings 651 have greater junction depths than the P body regions.

Figure 5D:
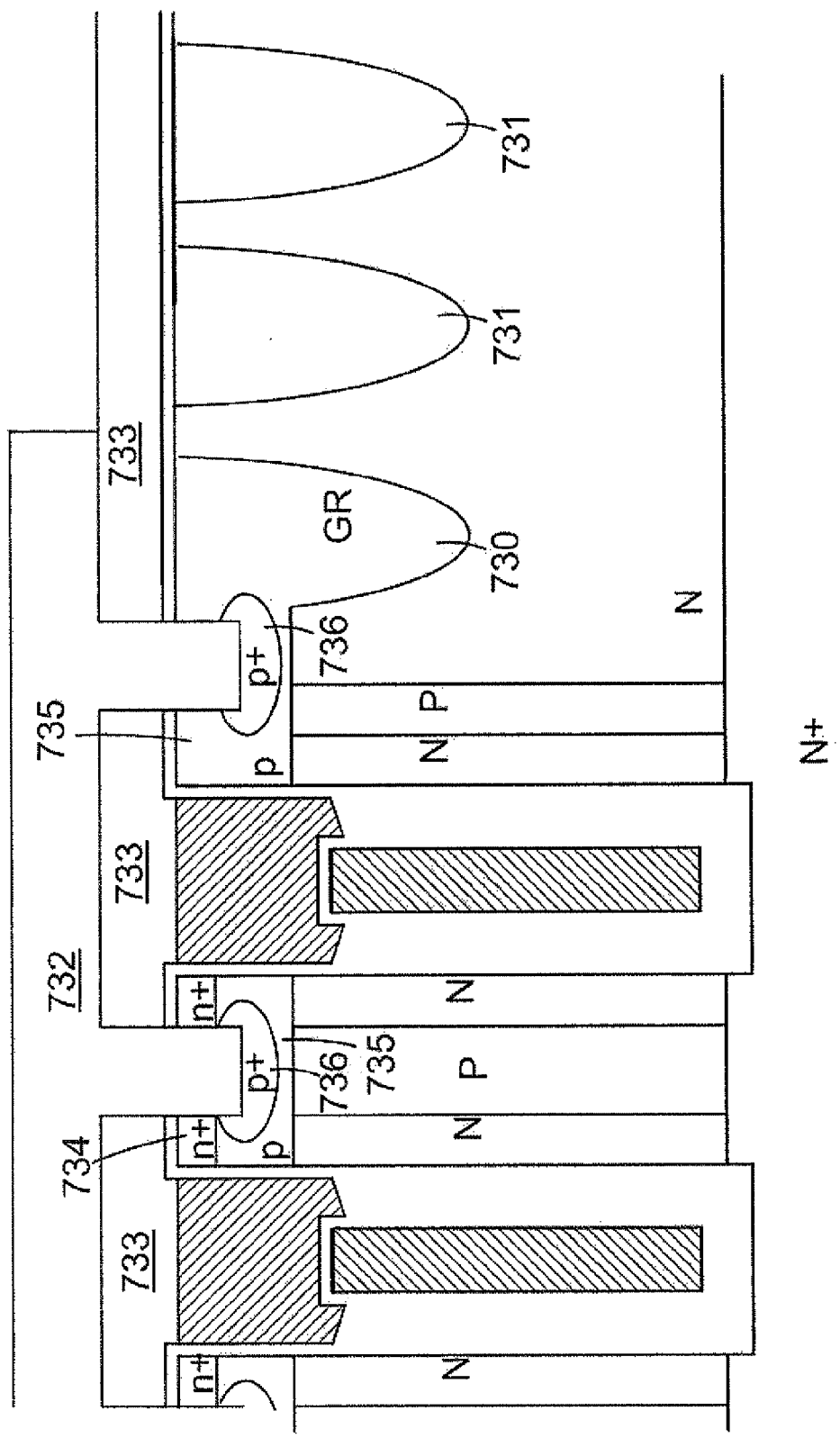
FIG. 5D is a cross-sectional view of another preferred embodiment according to the present invention.

FIG. 5D shows another preferred embodiment of the present invention, which is similar to that in FIG. 4B except that, in FIG. 5D, the N-channel super-junction trench MOSFET further comprises a P type guard ring 730 and multiple P type floating guard rings 731 in the termination area. Besides, the source metal 732 is formed onto the contact interlayer 733 and penetrating through the contact interlayer 733 to contact with the n+ source region 734, the p body region 735 and the p+ body contact doped region 736 in the active area or only contact with the p body region 735 and the p+ body contact region 736 near the termination area.

FIG. 6A shows another preferred embodiment of the present invention, which is similar to that in FIG. 3A except that, in FIG. 6A, the source metal 836 is connected to the n+ source region 831 by a trenched source-body contact 832. The trenched source-body contact 832 is penetrating through the contact interlayer 833, the n+ source region 831 and extending into the p body region 834, the trenched source-body contact 832 is filled with the source metal 836 composed of an Al alloys layer padded by a barrier metal layer of Ti/TiN or Co/TiN as a contact metal plug 835, for example, a source metal plug as employed in FIG. 6A. Furthermore, in the p body region 834, a p+ body contact doped region 837 is formed surrounding at least bottom of the trenched source-body contact 832 underneath the n+ source region 831 to reduce the contact resistance between the p body region 834 and the contact metal plug 835 in the trenched source-body contact 832.

Figure 6B:
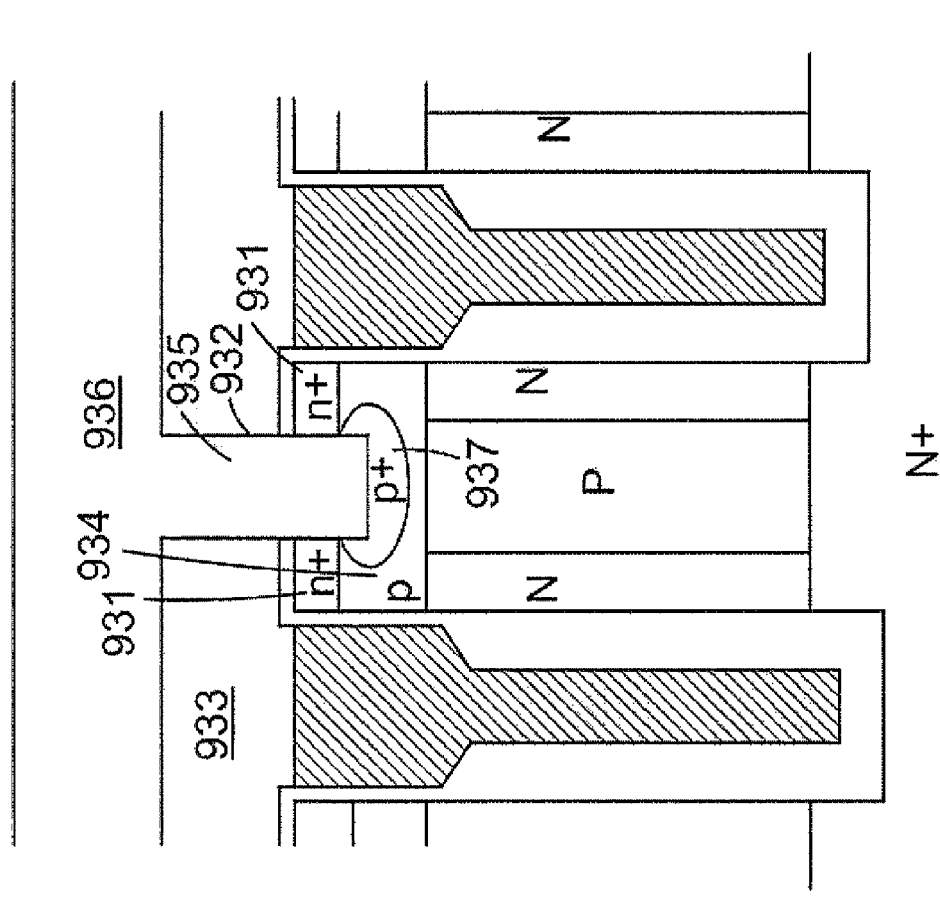
FIG. 6B is a cross-sectional view of another preferred embodiment according to the present invention.

FIG. 6B shows another preferred embodiment of the present invention, which is similar to that in FIG. 3B except that, in FIG. 6B, the source metal 936 is connected to the n+ source region 931 by a trenched source-body contact 932 instead of planar contact in FIG. 38. The trenched source-body contact 932 is penetrating through the contact interlayer 933, the n+ source region 931 and extending into the p body region 934, the trenched source-body contact 932 is filled with the source metal 936 composed of an Ai alloys layer padded by a barrier metal layer of Ti/TiN or Co/TiN as a contact metal plug 935, for example, a source metal plug as employed in FIG. 6B. Furthermore, in the p body region 934, a p+ body contact doped region 937 is formed surrounding at least bottom of the trenched source-body contact 932 underneath the n+ source region 931 to reduce the contact resistance between the p body region 934 and the contact metal plug 935 in the trenched source-body contact 932.

Figure 7A:
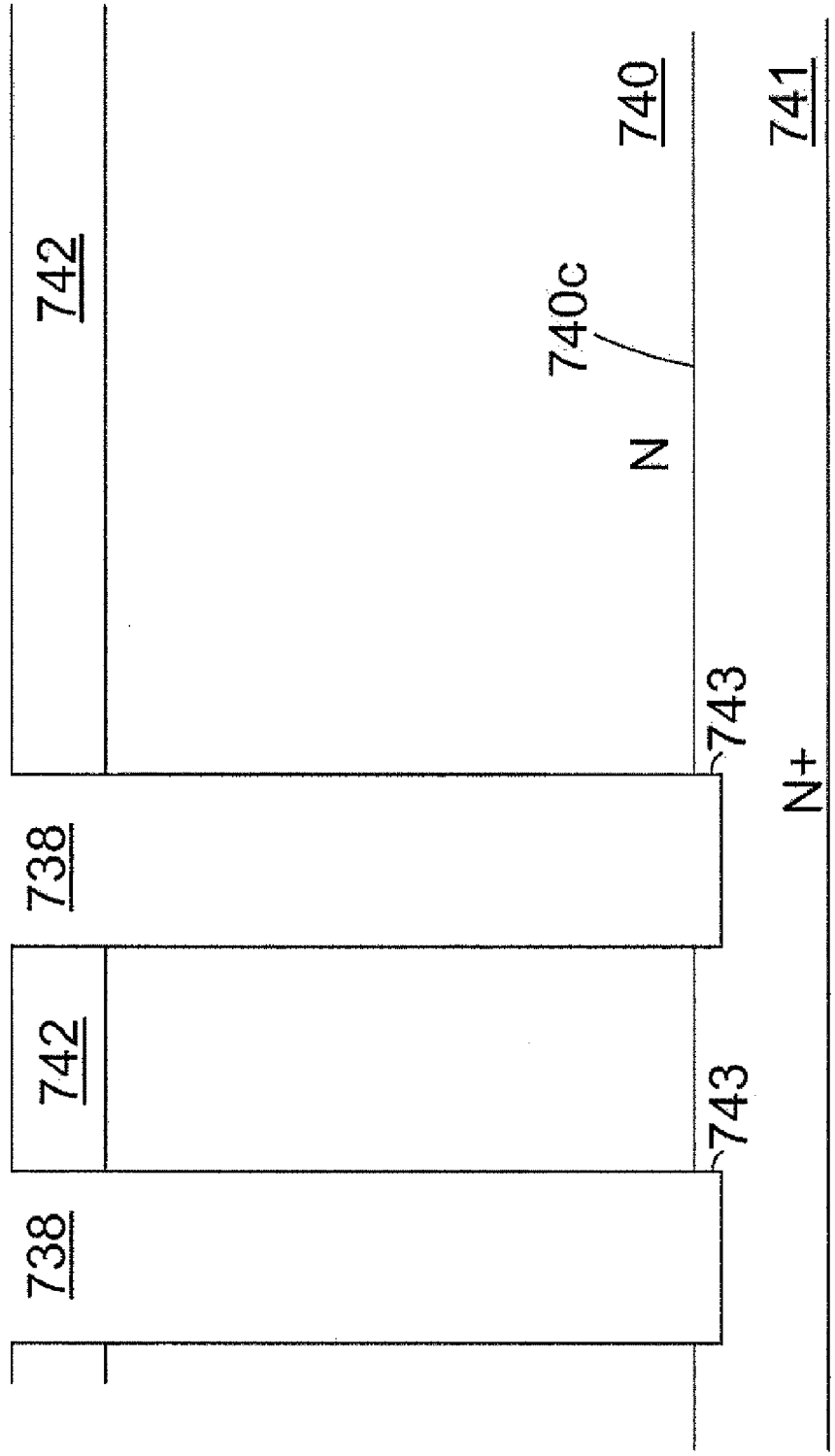
FIGS. 7A~7G are a serial of side cross-sectional views for showing the processing steps for fabricating the super-junction trench MOSFET as shown in FIG. 5D, with a preferred method for fabricating the first and the second doped column regions.

FIGS. 7A to 7G are a series of exemplary steps that are performed to form the inventive super-junction trench MOSFET in FIG. 5D, with a preferred method to fabricate the first and the second doped column regions. In FIG. 7A, an N epitaxial layer 740 is formed onto an N+ substrate 741, wherein the N+ substrate has a higher doping concentration than the N epitaxial layer 740, and share a common interface 740c with the N epitaxial layer 740. Next, a block layer 742, which can be implemented by using an oxide layer, is formed covering a top surface of the N epitaxial layer 740. Then, after a trench mask (not shown) is applied onto the block layer 742, a plurality of trenches 743 are etched through open regions 738 of the block layer 742 formed by dry etch, the N epitaxial layer 740, the interface 740c and further extending into the N+ substrate 741 by successively dry silicon etch, Meanwhile, a plurality of mesas are formed between two adjacent trenches 743 with each mesa having an adjoining trench.

Figure 7B:
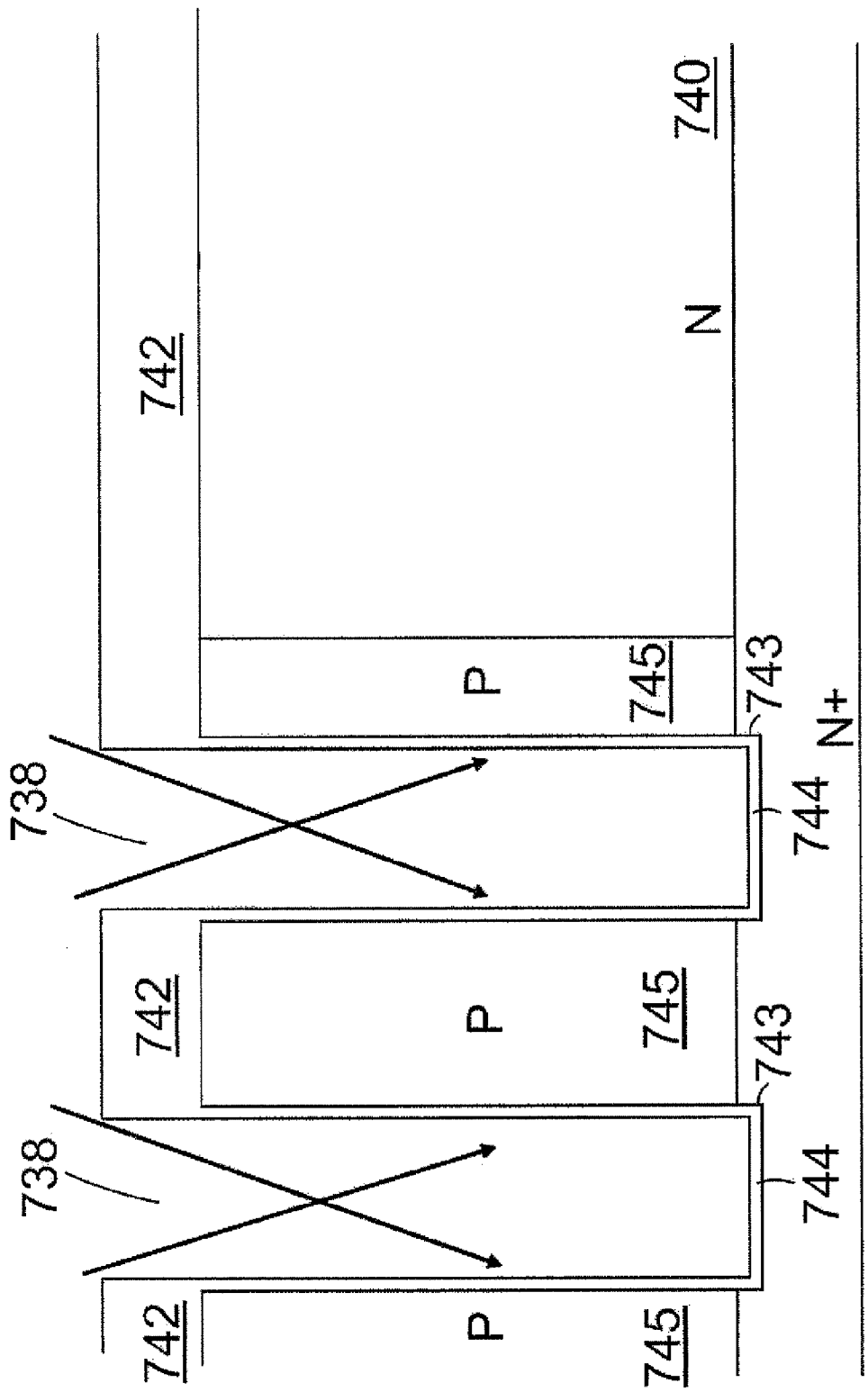

In FIG. 7B, a sacrificial oxide (not shown) is first grown and then removed to eliminate the plasma damage introduced during opening the trenches 743. The block layer 742 is still substantially remained on the mesas and a termination area after the sacrificial oxide removed to block sequential angle ion implantations into top surfaces of the mesas and the termination area for prevention of degradation in breakdown voltage, especially in the termination area. After that, a screen oxide 744 is grown along inner surfaces of the trenches 743. Then, an angle Ion Implantation of Boron dopant through the open regions 738 followed with a P type dopant diffusion is carried out to form P type first doped column regions 745 with a column shape between two adjacent trenches 743.

Figure 7C:
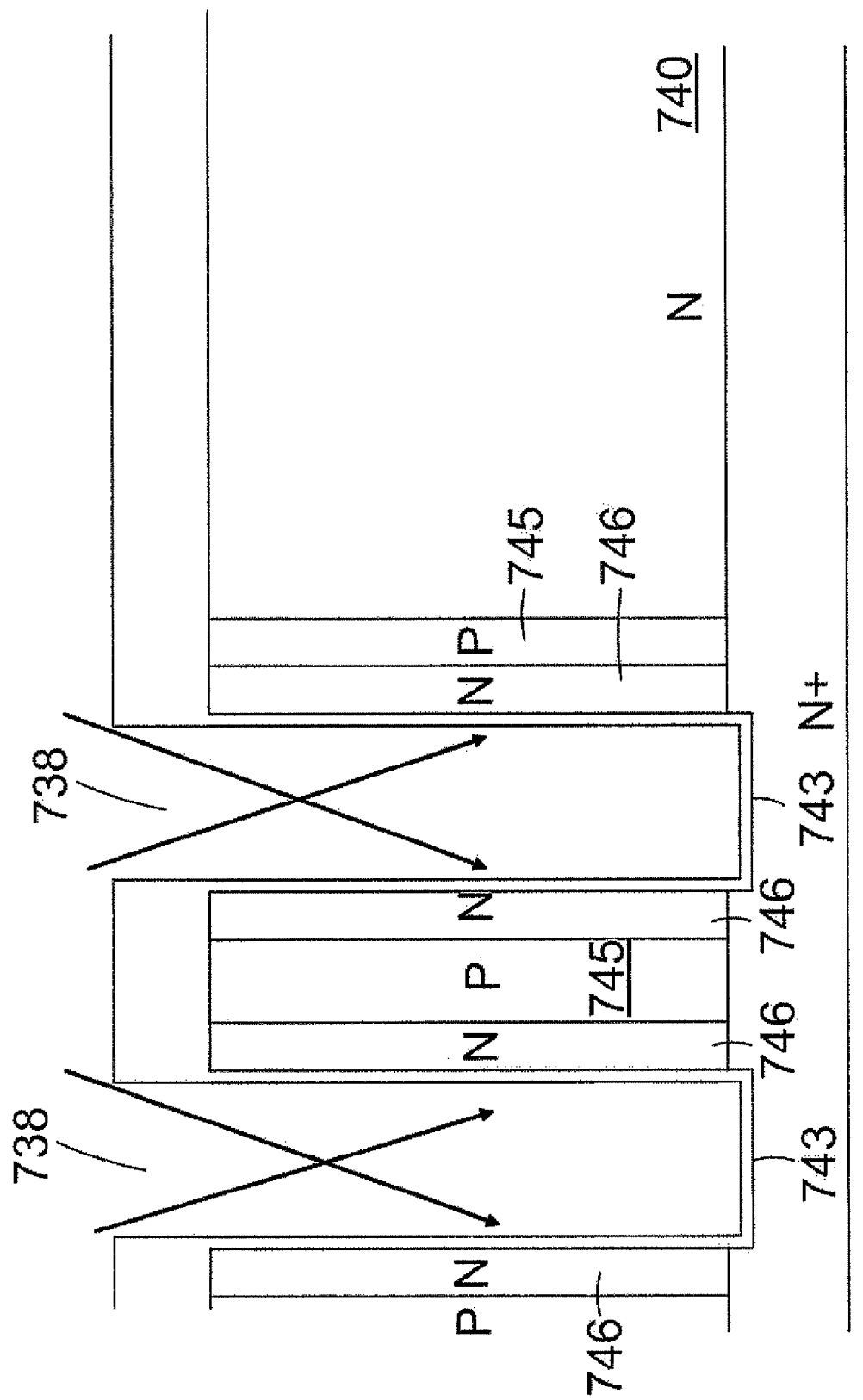

In FIG. 7C, another angle Ion Implantation of Arsenic or Phosphorus dopant followed with an N type dopant diffusion is carried out through the open regions 738 to form N type second doped column regions 746 with a column shape adjacent to sidewalls of the trenches 743, formed in parallel and surrounding the P type first doped column regions 745.

Figure 7D:
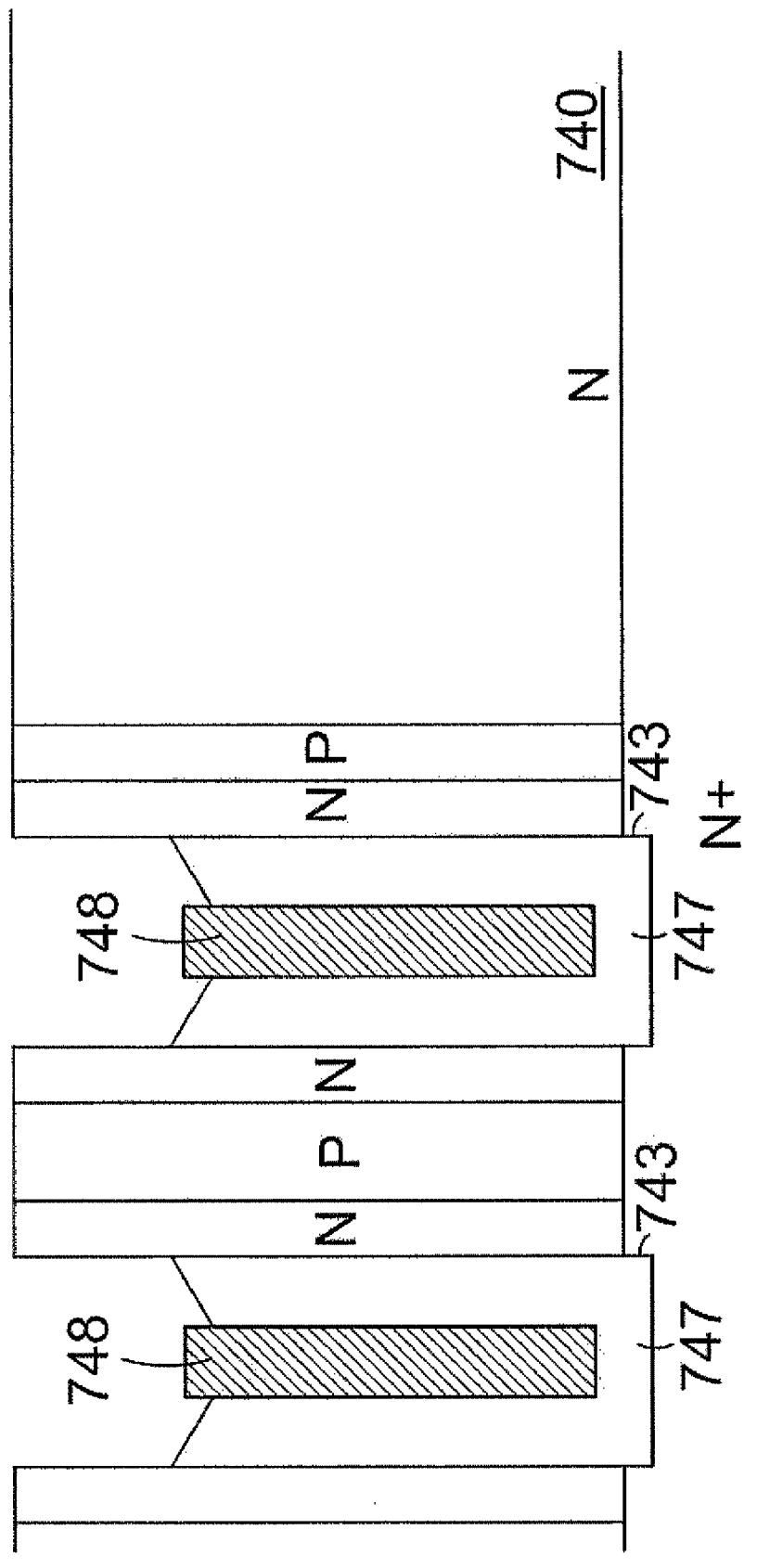

In FIG. 7D, a first insulation layer 747 is formed lining the inner surface of the trenches 743 by thermal oxide growth or thick oxide deposition after removing the block layer 742 and the screen oxide layer 744. Then, a first doped poly-silicon layer is deposited onto the first insulating layer 747 filling the trenches 743 to serve as source electrodes 748. Next, the source electrodes 748 and the first insulating layer 747 are etched back, leaving enough portions in lower portion of the trenches 743.

Figure 7E:
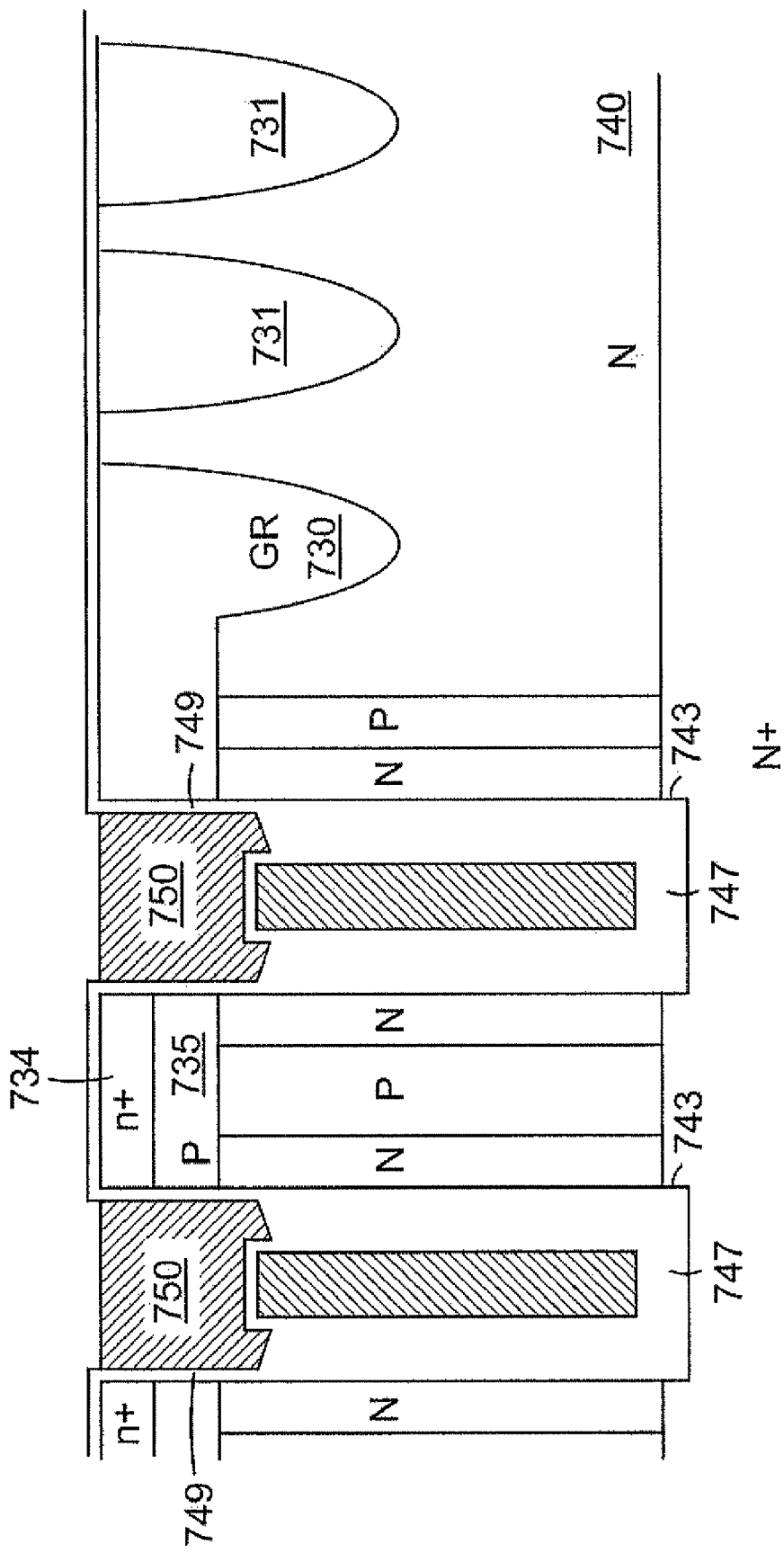

In FIG. 7E, a second insulation layer 749 as a gate oxide is grown along upper sidewalls of the trenches 743 and top surfaces of the source electrodes 748, and the second insulating layer 749 has a thinner thickness than the first insulating layer 747. Then, a second doped poly-silicon layer is deposited onto the second insulating layer 749 filling an upper portion of the trenches 743 to serve as gate electrodes 750. Next, the gate electrodes 750 are etched back by CMP or Plasma Etch. After applying a Guard Ring mask (not shown) onto the first main surface, a step of Ion Implantation with P type dopant is carried out and followed by a diffusion step to form a Guard Ring 730 and multiple floating guard rings 731 in the termination area. Then, after applying a body mask (not shown), another step of Ion Implantation with P type dopant is carried out and followed by a diffusion step to form a p body region 735 between every two adjacent of the trenches 743 and onto the N type second doped column regions and the P type first doped column regions. Then, after applying a source mask (not shown), a step of Ion Implantation with N type dopant is carried out to form an n+ source region 734 near a top surface of the P body region 735 and flanking the trenches 743, and the n+ source region 734 has a higher doping concentration than the N epitaxial layer 740.

Figure 7F:
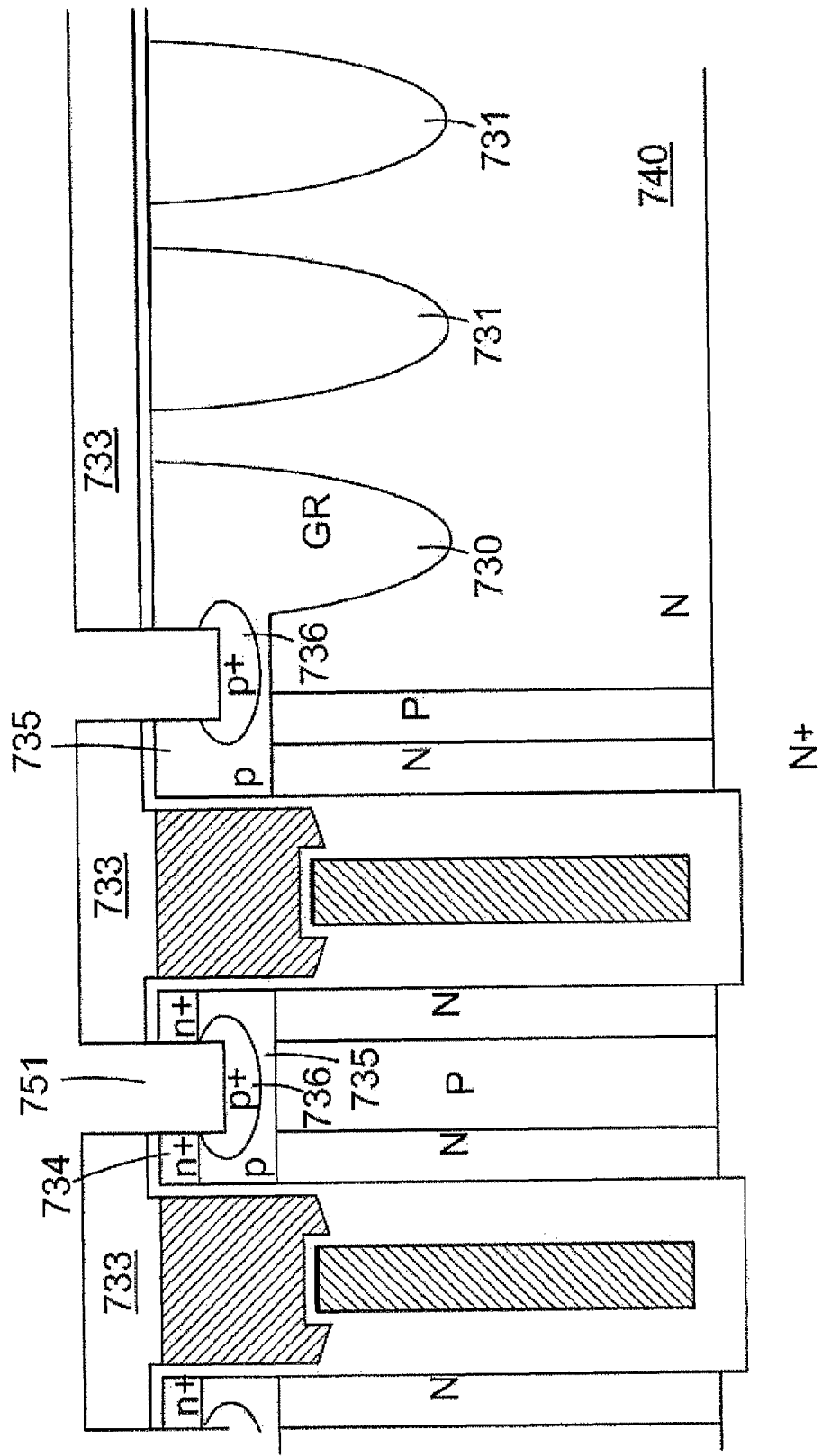

In FIG. 7F, an oxide layer is deposited onto the top surface of the epitaxial layer to serve as a contact interlayer 733. Then, after applying a contact mask (not shown) onto the contact interlayer 733, contact holes 751 are formed by successively dry oxide etch and dry silicon etch. The contact holes 751 are penetrating through the contact interlayer 733, the n+ source region 734 and extending into the p body region 735 in an active area, or penetrating the contact interlayer 733 and extending into the p body region 735 near the termination area. Next, a BF2 Ion Implantation is performed to form a p+ body contact doped region 736 within the p body region 735 and surrounding at least bottom of each contact hole 751.

Figure 7G:
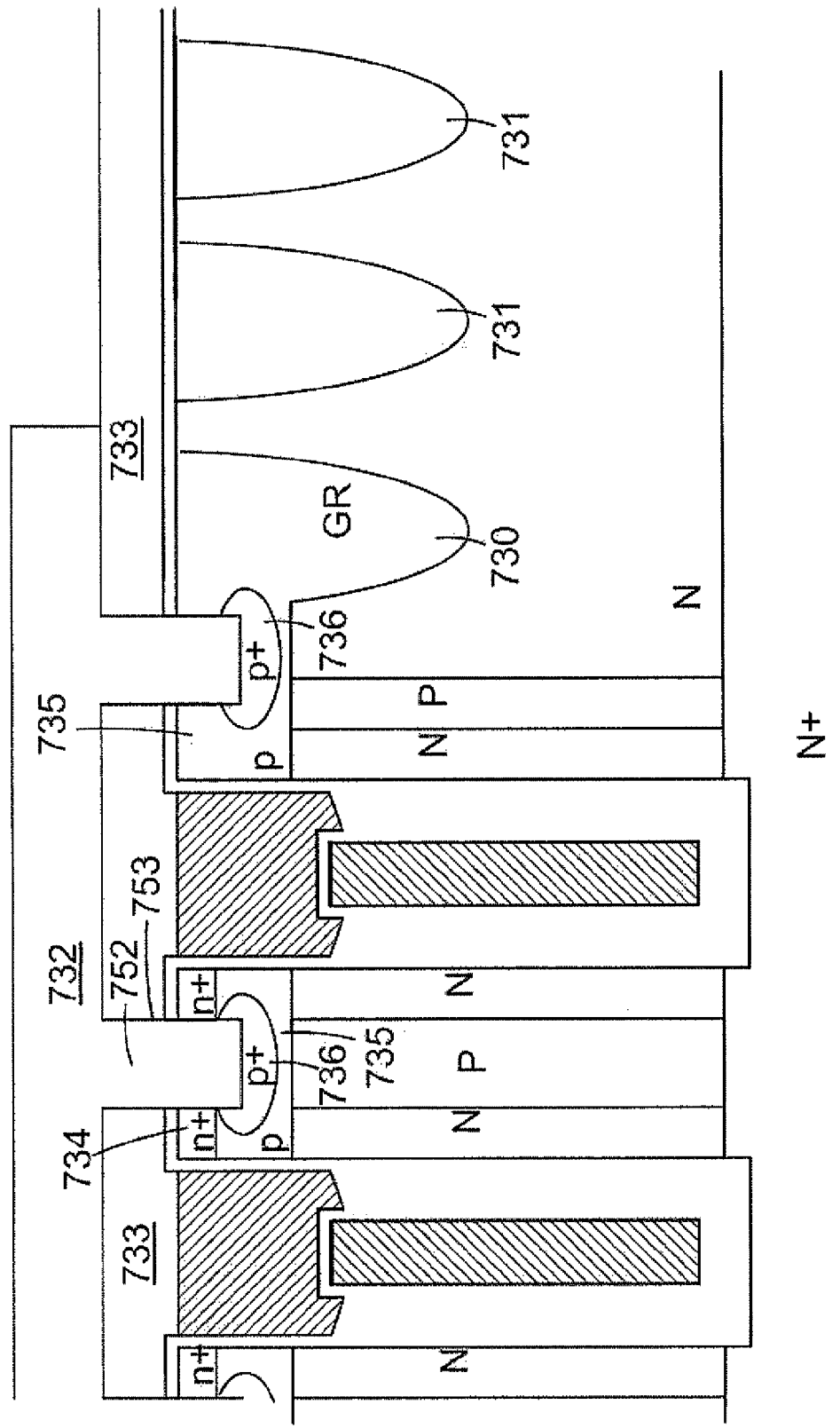

In FIG. 7G, a metal layer comprising Al alloys padded with a resistance-reduction layer Ti or Ti/TiN is deposited onto a top surface of the contact interlayer 733 and extending into the contact holes 751 to serve as a source metal plug 752 for a trenched source-body contact 753. Then, After applying a source mask (not shown), the metal layer is etched to function as a source metal 732 to contact with the n+ source region 734 and the p body region 735.

Figure 8A:
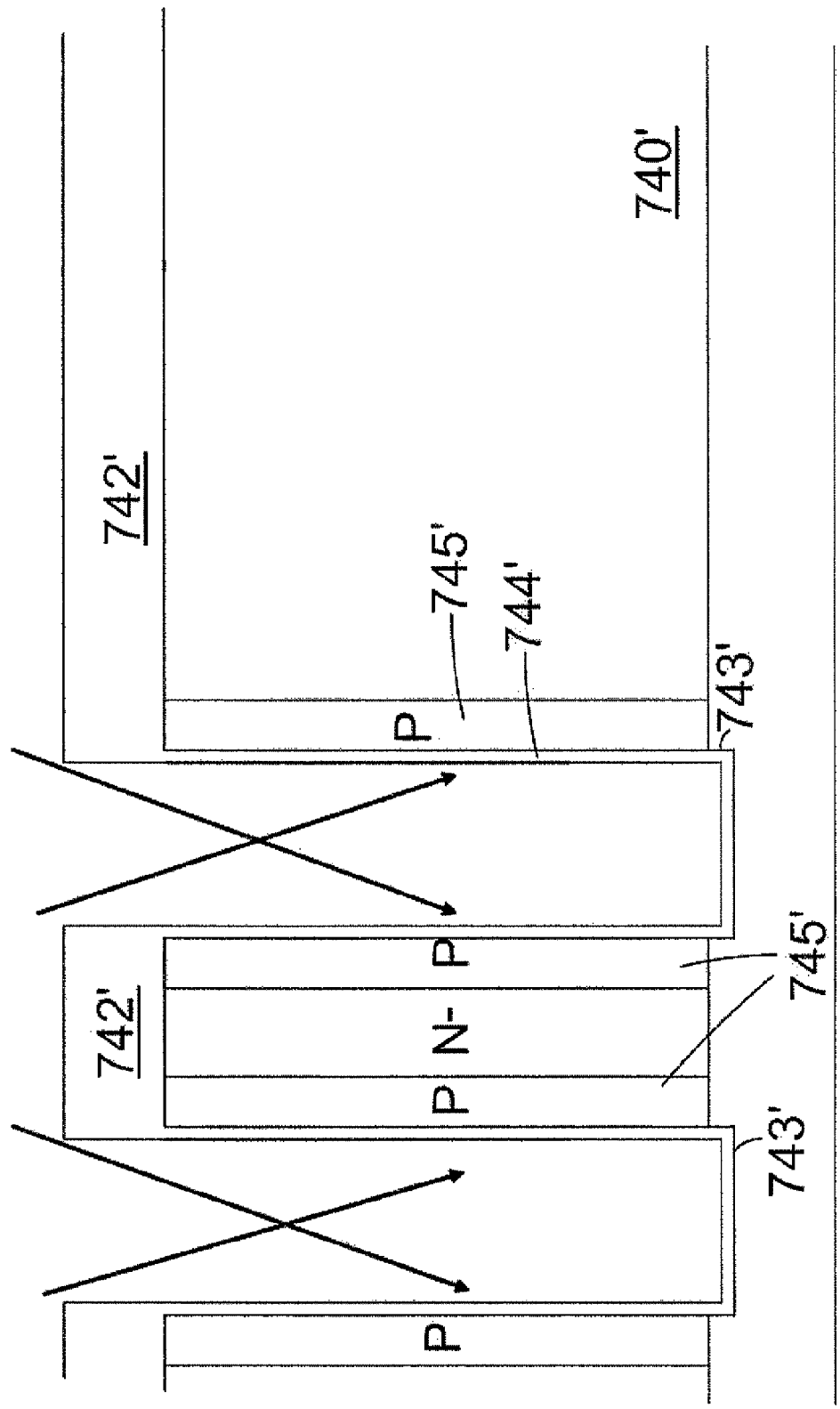

Alternatively, the formation of the P type first doped column regions and the N type second doped column regions as described in FIGS. 7B and 7C can be combined to a single P type and N type column region diffusion as described in FIG. 8A~8C for cost reduction.

In FIG. 8A, after forming the block layer 742' and a plurality of trenches 743' and a plurality of mesas in the N epitaxial layer 740', a sacrificial oxide (not shown) is first grown and then removed to eliminate the plasma damage introduced during opening the trenches 743'. The block layer 742' is still substantially remained on the mesas and a termination area after the sacrificial oxide removed to block sequential angle ion implantations into top surfaces of the mesas and the termination areas for prevention of degradation in breakdown voltage, especially in the termination area. After that, a screen oxide 744' is grown along an inner surface of the trenches 743'. Then, angle Ion Implantation of Boron dopant is carried out for formation of P type first doped column regions 745' with a column shape and only adjacent to sidewalls of the trenches 743'.

In FIG. 8B, angle Ion Implantation of Arsenic or Phosphorus dopant is carried out for formation of N type second doped column regions 746' with a column shape adjacent to the sidewalls of the trenches 743' and in parallel with the P typed first doped column regions 745', formed in parallel and surrounding the P type first doped column regions 745'.

In FIG. 8C, a diffusion step for both the P type first doped column regions 745' and the N type second doped column regions 746' is carried out, therefore, the P type first doped column regions 745' are diffused to be in parallel surrounding with the N type second doped column regions 746'.

Although the present invention has been described in terms of the presently preferred embodiments, it is to be understood that such disclosure is not to be interpreted as limiting. Various alternations and modifications will no doubt become apparent to those skilled in the art reading the above disclosure. Accordingly, it is intended that the appended claims be interpreted as covering all alternations and modifications as fall within the true spirit and scope of the invention.

What is claimed is: ,

1. A Method for manufacturing a super-junction trench MOSFET with resurf stepped oxide comprising the steps of:
   growing an epitaxial layer of a first conductivity type upon a heavily doped substrate of said first conductivity type;
   forming a block layer on a top surface of said epitaxial layer;
   forming a trench mask on said block layer;
   forming a plurality of trenches, and mesas between adjacent trenches in said epitaxial layer by etching through open regions in said block layer;
   keeping said block layer substantially covering said mesas and a termination area after formation of said trenches to block sequential angle ion implantation into top surfaces of said mesas and said termination area;
   carrying out an angle ion implantation of a second conductivity type dopant into said mesas through said open regions in said block layer to form a first doped column regions between said adjacent trenches;
   carrying out an angle ion implantation of said first conductivity type dopant into said mesas through said open regions in said block layer to form a second doped column regions adjacent to sidewalls of said trenches and in parallel surrounding said first doped column regions;
   removing said block layer after formation of said first and second doped column regions;
   forming a first insulation layer along inner surface of said trenches;
   depositing a first doped poly-silicon filling said trenches serving as source electrodes;
   etching back said source electrodes and said first insulation layer from upper portion of said trenches and from the top surface of said epitaxial layer;
   forming a second insulation layer as a gate oxide layer along upper sidewalls of said trenches and onto top surfaces of said source electrodes, wherein said second insulation layer has a thinner thickness than said first insulation layer;
   depositing a second doped poly-silicon filling the upper portion of said trenches to serve as gate electrodes;
   etching back said gate electrodes by CMP or plasma etch from top surface of said mesas;
   applying a body mask onto the top surface of said epitaxial layer;
   carrying out a body implantation of said second conductivity type dopant and a body diffusion to form body regions;
   removing said body mask and applying a source mask onto the top surface of said epitaxial layer;
   carrying out a source implantation of said first conductivity type dopant and a source diffusion to form source regions,
   forming a contact interlayer covering entire top surface;
   forming a plurality of trenched source-body contacts penetrating through said contact interlayer, said source regions and extending into said body regions; and
   forming body contact doped regions of said second conductivity type in said body regions and surrounding at least bottoms of said trenched source-body contacts, said body contact doped regions having a heavier doping concentration than said body regions.

2. The method of claim 1, further comprising:
   prior to carrying out the angle ion implantation of said first conductivity type dopant, diffusing said second conductivity type dopant into said mesas to form said first doped column regions between adjacent said trenches;
   prior to forming said first insulation layer along inner surfaces of said trenches, diffusing said first conductivity type dopant into said mesas to form said second doped column regions adjacent to sidewalls of said trenches and in parallel surrounding said first doped column regions.

3. The method of claim 1, further comprising:
   prior to forming said first insulation layer along inner surfaces of said trenches, diffusing both of said first conductivity type dopant and said second conductivity type dopant into said mesas simultaneously to respectively form said first doped column regions between two adjacent said trenches, and second doped column regions adjacent to sidewalls of the trenches and in parallel surrounding said first doped column regions.

4. The method of claim 1, wherein said trenches are extended into said heavily doped substrate.

5. The method of claim 1, wherein said trenches are disposed above said heavily doped substrate.

6. The method of claim 1, further comprising:
   prior to carrying out the angle ion implantation of said first conductivity type dopant and said second conductivity type dopant, forming a screen oxide along an inner surface of said trenches.

7. The method of claim 6, further comprising:
   prior to forming said screen oxide, forming a sacrificial oxide layer and removing said sacrificial oxide to eliminate plasma damage when forming said trenches.

8. The method of claim 1, prior to forming said body regions, further comprising:
   applying a guard ring mask and carrying out a guard ring ion implantation and a guard ring diffusion to form multiple guard rings in said termination area.

9. The method of claim 1, wherein forming said trenched source-body contacts comprising:

depositing a tungsten layer padded by a barrier metal layer in said trenched source-body contacts.

10. The method of claim 1, wherein forming said trenched source-body contacts comprising:

depositing a source metal layer padded with a barrier metal layer directly into said trenched source-body contacts.

* * * * *